(12) United States Patent
Ebihara et al.

(10) Patent No.: US 8,028,886 B2
(45) Date of Patent: Oct. 4, 2011

(54) BONDING TOOL, ELECTRONIC COMPONENT MOUNTING APPARATUS AND ELECTRONIC COMPONENT MOUNTING METHOD

(75) Inventors: Hiroshi Ebihara, Osaka (JP); Katsuhiko Watanabe, Osaka (JP); Ryo Fujita, Hyogo (JP)

(73) Assignee: Panasonic Corporation, Osaka (JP)

( * ) Notice: Subject to any disclaimer, the term of this patent is extended or adjusted under 35 U.S.C. 154(b) by 42 days.

(21) Appl. No.: 12/630,943

(22) Filed: Dec. 4, 2009

(65) Prior Publication Data

US 2010/0140326 A1    Jun. 10, 2010

(30) Foreign Application Priority Data

Dec. 8, 2008    (JP) .................................. 2008-311866
Nov. 13, 2009    (JP) .................................. 2009-260297

(51) Int. Cl.
    *B23K 1/06* (2006.01)
(52) U.S. Cl. ..................................... 228/1.1; 228/110.1
(58) Field of Classification Search ............... 228/110.1, 228/1.1
    See application file for complete search history.

(56) References Cited

U.S. PATENT DOCUMENTS

| 3,615,968 | A | * | 10/1971 | Ceresa et al. | ................. | 156/73.4 |
| 5,340,433 | A | * | 8/1994 | Crump | .......................... | 156/578 |
| 5,730,832 | A | * | 3/1998 | Sato et al. | ..................... | 156/499 |
| 5,884,831 | A | * | 3/1999 | Sato et al. | ..................... | 228/6.2 |

FOREIGN PATENT DOCUMENTS

JP    2005-347505    12/2005

* cited by examiner

*Primary Examiner* — David Sample
*Assistant Examiner* — Megha Mehta
(74) *Attorney, Agent, or Firm* — RatnerPrestia

(57) ABSTRACT

A bonding tool comprises: a horn which transmits an ultrasonic vibration; a ultrasonic transducer which is provided on one end of the horn, and produces the ultrasonic vibration; a heater disposition part, in which a heater is disposed, which is provided between the one end of the horn and the other end of the horn; a bonding action part which is provided between the one end of the horn and the other end of the horn, holds an electronic component, and is heated by the heater; a first cooling part, through which a fluid flows, which is provided between the heater disposition part and the one end of the horn; and a second cooling part, through which a fluid flows, which is provided between the heater disposition part and the other end of the horn.

14 Claims, 16 Drawing Sheets

BONDING TOOL, ELECTRONIC COMPONENT MOUNTING APPARATUS AND ELECTRONIC COMPONENT MOUNTING METHOD

BACKGROUND OF THE INVENTION

1. Field of the Invention

The present invention relates to a bonding tool, an electronic component mounting apparatus and an electronic component mounting method for mounting an electronic component on a circuit board or the like.

2. Related art of the Invention

There are many known bonding methods for bonding a bump electrode of an electronic component to an electrode on a printed circuit board.

For example, an ultrasonic bonding method, which is one of such bonding methods, is capable of bonding an electronic component to a circuit board in a short time.

Here, the ultrasonic bonding method is a bonding method that, while pressing an electronic component held on a bonding action part against the circuit board, makes the electronic component vibrate by ultrasonic vibration so as to bond electrically an electrode of the electronic component to an electrode of a circuit board at the atomic level by utilizing bonding caused by destruction and dispersion of the surface coating induced from local slip at the contact surface.

Referring to FIG. 16, a configuration and an operation of a conventional bonding tool using the above-mentioned ultrasonic bonding method will be described.

FIG. 16 is a schematic partial cross-sectional view of a conventional bonding tool 1000.

The conventional bonding tool 1000 is an apparatus for making an electronic component 1910 vibrate by an ultrasonic transducer 1400 so as to bond the electronic component 1910 to a circuit board 1920 (see Japanese Patent Laid-Open No. 2005-347505, for example).

The entire disclosure of the literature described above is incorporated herein by reference in its entirety.

A horn 1200 is shaped like a prism with a longitudinal direction agreeing with the X direction, and an ultrasonic vibration, which is generated by the ultrasonic transducer 1400 provided at one end of the horn 1200 on the (-X) side, is transmitted through the horn 1200 in the X direction and applied to the electronic component 1910 via a bonding action part 1500.

The reliability of bonding of the electronic component 1910 to the circuit board 1920 is improved using a heater 1600 inserted from the (+X) side into a heater installation cavity part 1610 which penetrates the horn 1200 in the X direction in which the ultrasonic vibration is transmitted.

That is, heat produced by the heater 1600 is transmitted through the horn 1200 and then applied to the electronic component 1910 via the bonding action part 1500.

Lead lines 1810 and 1820 are lines for connecting the heater 1600 and a thermocouple 1700 to an external power supply (not shown), respectively, and are coupled to a bracket 1110 fastened to a lift block 1100.

The heat produced by the heater 1600 is also transmitted to the ultrasonic transducer 1400 via the horn 1200.

In a consequence, concerning the heat-sensitive ultrasonic transducer 1400, there is some fear of a shortening of its life span, a change of its electrical characteristics, a variation of its vibration characteristics and so on.

Accordingly, a cooling part 1300 of four air holes is provided between the heater 1600 and the ultrasonic transducer 1400, the four air holes penetrating the horn 1200 in the Y direction perpendicular to the X direction in which the ultrasonic vibration is transmitted with air being supplied via a suction pad 1310 to flow through the four air holes.

Thus, the heat which would otherwise be transmitted to the ultrasonic transducer 1400 is diffused by the air flowing through the air holes, and the adverse effect of the heat produced by the heater 1600 on the ultrasonic transducer 1400 is reduced.

SUMMARY OF THE INVENTION

However, the above-mentioned conventional bonding tool has been found to be unsuitable for ultrasonic bonding of higher quality.

Specifically, the inventor has found that this is because the horn 1200, which expands when heated by the heater 1600, expands asymmetrically during the heating state in the X direction which is the longitudinal direction of the horn 1200.

More specifically, between the heater 1600 and the one end of the horn 1200 on the (-X) side, the degree of expansion in the heating state is small, because the cooling part 1300 is provided and thus the heat is diffused by the air flowing through the air holes.

To the contrary, between the heater 1600 and the other end of the horn 1200 on the (+X) side, the degree of expansion in the heating state is large, because no cooling part is provided and thus the heat is less likely to be diffused.

As a result, the horn 1200 expands asymmetrically during the heating state in the X direction which is the longitudinal direction of the horn 1200, and this leads to a deviation of the direction or amplitude of the vibration of the held electronic component 1910 from the designed value, a change of the vibration mode and so on, since the electronic component 1910 is inclined with respect to the circuit board 1920.

In view of such problems of the above-mentioned prior art, the present invention provides a bonding tool, an electronic component mounting apparatus and an electronic component mounting method, which are capable of performing ultrasonic bonding of higher quality.

The 1$^{st}$ aspect of the present invention is a bonding tool, comprising:

a horn which transmits an ultrasonic vibration;

an ultrasonic transducer which is provided on one end of the horn, and produces the ultrasonic vibration;

a heater disposition part, in which a heater is disposed, which is provided between the one end of the horn and the other end of the horn;

a bonding action part which is provided between the one end of the horn and the other end of the horn, holds an electronic component, and is heated by the heater;

a first cooling part, through which a fluid flows, which is provided between the heater disposition part and the one end of the horn; and a second cooling part, through which a fluid flows, which is provided between the heater disposition part and the other end of the horn.

The 2$^{nd}$ aspect of the present invention is the bonding tool according to the 1$^{st}$ aspect of the present invention, wherein the heater disposition part is a heater insertion hole which penetrates the horn in a direction that is perpendicular to a direction in which the ultrasonic vibration is transmitted.

The 3$^{rd}$ aspect of the present invention is the bonding tool according to the 2$^{nd}$ aspect of the present invention, wherein the heater is fixed to a heater holding block, with a predetermined clearance, away from a wall of the heater insertion hole, the heater holding block being disposed outside of the horn and connected to a pressing unit externally provided.

The 4th aspect of the present invention is the bonding tool according to the 1st aspect of the present invention, wherein the bonding action part is provided on a lower surface of the horn, and the heater disposition part is provided immediately above the bonding action part.

The 5th aspect of the present invention is the bonding tool according to the 1st aspect of the present invention, wherein a distance between the heater disposition part and the first cooling part is equal to a distance between the heater disposition part and the second cooling part.

The 6th aspect of the present invention is the bonding tool according to the 1st aspect of the present invention, wherein the first cooling part and the second cooling part are air holes, through which a gas flows, which penetrate the horn in a direction that is perpendicular to a direction in which the ultrasonic vibration is transmitted.

The 7th aspect of the present invention is the bonding tool according to the 6th aspect of the present invention, wherein an opening of the air hole is shaped like a narrow rectangle, whose longitudinal direction agrees with the direction in which the ultrasonic vibration is transmitted.

The 8th aspect of the present invention is the bonding tool according to the 1st aspect of the present invention, wherein the horn is shaped like a prism, the bonding action part is provided on a lower surface of the horn, and horn holding blocks for holding the horn are provided on each of two side surfaces of the horn.

The 9th aspect of the present invention is the bonding tool according to the 8th aspect of the present invention, wherein the horn holding block has a rib provided on the side surface of the horn, and a body connected to the rib, and a longitudinal direction of the rib agrees with a direction that is perpendicular to a direction in which the ultrasonic vibration is transmitted, and is perpendicular to the lower surface of the horn.

The 10th aspect of the present invention is the bonding tool according to the 9th aspect of the present invention, wherein the body has a groove which is formed, adjacent to the rib, in the longitudinal direction of the rib.

The 11th aspect of the present invention is the bonding tool according to the 8th aspect of the present invention, wherein the horn holding blocks are provided so that two blocks are disposed on each of the two side surfaces of the horn, the first cooling part is provided between one horn holding block of the two horn holding blocks, which is nearer to the one end of the horn, and the one end of the horn, and the second cooling part is provided between the other horn holding block of the two horn holding blocks, which is nearer to the other end of the horn, and the other end of the horn.

The 12th aspect of the present invention is the bonding tool according to the 1st aspect of the present invention, wherein the ultrasonic vibration has two nodal points, the first cooling part is provided between one nodal point of the two nodal points, which is nearer to the one end of the horn, and the one end of the horn, and the second cooling part is provided between the other nodal point of the two nodal points, which is nearer to the other end of the horn, and the other end of the horn.

The 13th aspect of the present invention is the bonding tool according to the 1st aspect of the present invention, wherein a fluid flowing unit, which allows the fluid to flow through at least one of the first cooling part and the second cooling part, is externally provided.

The 14th aspect of the present invention is the bonding tool according to the 1st aspect of the present invention, wherein a suction port of a suction path for holding the electronic component by suction is formed in the bonding action part, an exhaust port of the suction path is formed at a position nearer to the one end of the horn than the other end of the horn, in an upper surface of the horn, the suction path is shaped like the letter T, and a part of the suction path is a hole bored from a part of the one end of the horn, against which the ultrasonic transducer is to abut.

The 15th aspect of the present invention is an electronic component mounting apparatus, comprising:

a holding part which holds a target object;

a supplying part which supplies an electronic component; and a mounting unit which mounts the supplied electronic component on the held target object, wherein the mounting unit has a component mounting part, the component mounting part has a pressing unit and the bonding tool according to the 1st aspect of the present invention, and the pressing unit presses the electronic component against the target object via the bonding action part of the bonding tool.

The 16th aspect of the present invention is an electronic component mounting method of mounting the electronic component on the target object using the electronic component mounting apparatus according to the 15th aspect of the present invention, the electronic component mounting method comprising:

an electronic component holding step of holding the electronic component using the bonding action part;

a pressing step of pressing the electronic component against the target object using the pressing unit;

a ultrasonic vibration generating step of generating the ultrasonic vibration using the ultrasonic transducer;

a heating step of heating the bonding action part using the heater; and a fluid flowing step of allowing the fluid to flow using the first cooling part and the second cooling part.

The present invention can provide a bonding tool, an electronic component mounting apparatus and an electronic component mounting method, which are capable of performing ultrasonic bonding of higher quality.

Figure 1:
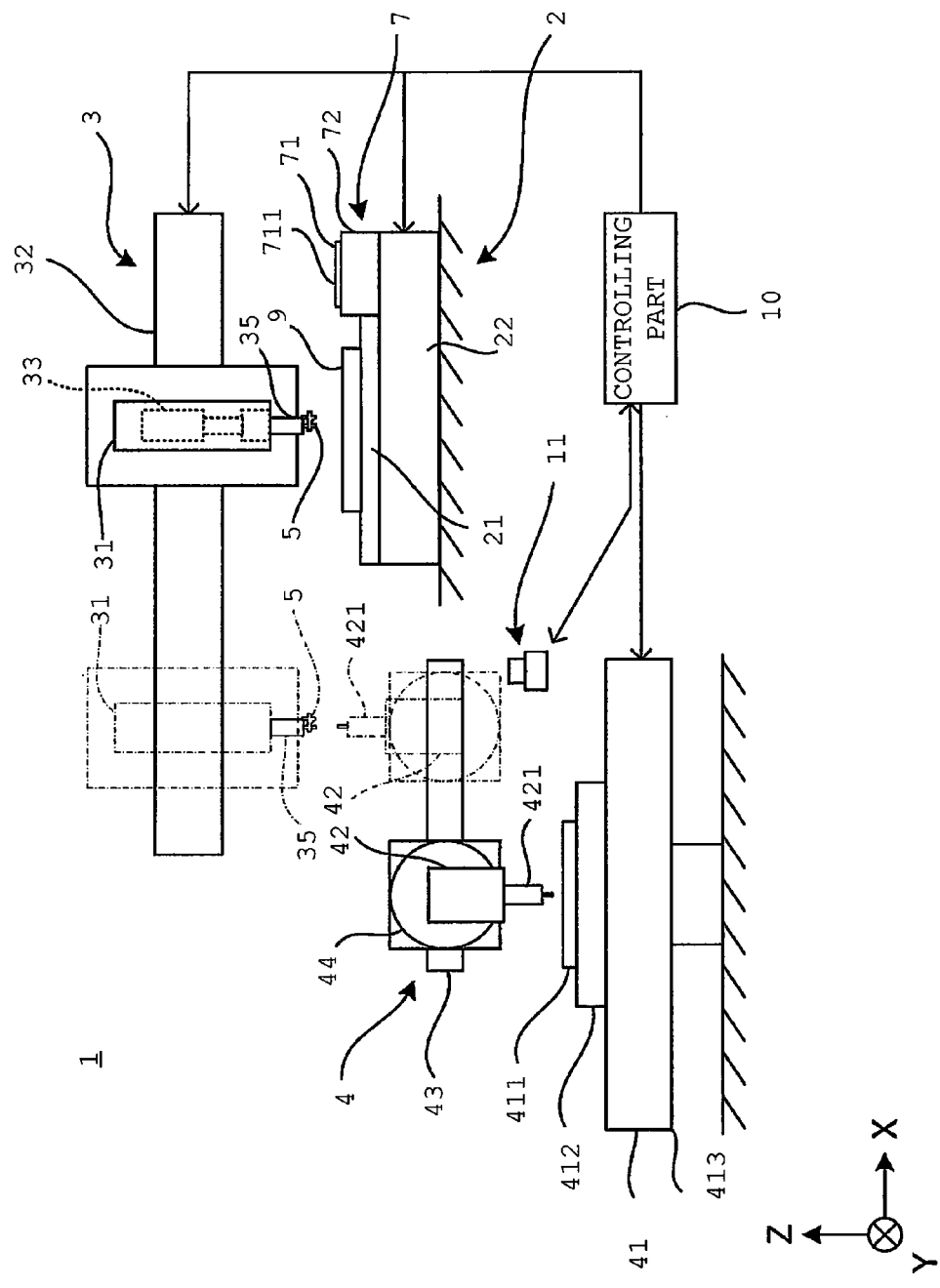
FIG. 1 is a schematic front view of an electronic component mounting apparatus according to an embodiment of the present invention.

DESCRIPTION OF SYMBOLS 8 electronic component
9 circuit board
33 pressing unit
34 tool supporting part
35 shaft
5 bonding tool
51 horn
511, 512, 513, 514 horn holding blocks
5111 horn fixing screw
515 first cooling part
516 second cooling part
52 ultrasonic transducer
53 bonding action part
531 tip end part
54 holder
541, 542 holder blocks
543, 544 holder block air holes
55 thermocouple fixing plate
57 heater
570 heater disposition part
571, 572 heater holding blocks
58 heater fixing screw
59 thermocouple
61, 62, 63 suction pads
64, 65, 66 tubes
600 suction path
1000 bonding tool
1100 lift block
1110 bracket
1200 horn
1300 cooling part
1310 suction pad
1400 ultrasonic transducer
1500 bonding action part
1600 heater
1610 heater installation cavity part
1700 thermocouple
1810, 1820 lead lines
1910 electronic component
1920 circuit board

PREFERRED EMBODIMENTS OF THE INVENTION

In the following, an embodiment of the present invention will be described in detail with reference to the drawings.

First, mainly referring to FIGS. 1 and 2, an entire configuration of an electronic component mounting apparatus 1 according to this embodiment will be described.

FIG. 1 is a schematic front view of the electronic component mounting apparatus 1 according to this embodiment of the present invention. FIG. 2 is a schematic plan view of the electronic component mounting apparatus 1 according to this embodiment of the present invention.

The electronic component mounting apparatus 1 is a so-called flip-chip packaging apparatus which inverts a small electronic component 8 (see FIG. 3 here and in the following description) used in system LSI (large scale integration) and performs mounting and bonding of the inverted electronic component 8 to a circuit board 9 as a target object, such as a printed board, at the same time.

The electronic component mounting apparatus 1 comprises a substrate holding part 2, a component mounting unit 3, a component supplying part 4, and an image pick-up part 11.

The component mounting unit 3, which mounts the electronic component 8 on the circuit board 9 held by the substrate holding part 2, is provided on the (+Z) side of, or in other words, above, the substrate holding part 2.

The component supplying part 4, which supplies the electronic component 8 to the component mounting unit 3, is provided on the (−X) side of the substrate holding part 2.

The image pick-up part 11, which picks up an image of the electronic component 8 supplied to the component mounting unit 3 by the component supplying part 4, is provided between the substrate holding part 2 and the component supplying part 4.

These mechanisms are controlled by the controlling part 10 and the mounting of the electronic component 8 to the circuit board 9 is performed.

Here, configurations of the substrate holding part 2, the component mounting unit 3, the component supplying part 4, and the image pick-up part 11 will be described in detail separately.

First, the substrate holding part 2 comprises a stage 21 on which the circuit board 9 is held, and a stage moving mechanism 22 which moves the stage 21 in the Y direction.

Next, the component mounting unit 3 comprises a component mounting part 31 having a pressing unit 33 and a bonding tool 5, and a mounting part moving mechanism 32 which moves the component mounting part 31 in the X direction.

The pressing unit 33 is a unit pressing the electronic component 8 against the circuit board 9 as the target object via a bonding action part 53 (see FIG. 3 here and in the following).

The pressing unit 33 has a shaft 35 which can be moved in the Z direction by a lift mechanism with a motor (not shown).

The bonding tool 5 is, as described later, attached to the pressing unit 33 and is lifted and lowered with respect to the circuit board 9.

A configuration of the bonding tool 5 will be described in detail later.

Next, the component supplying part 4 comprises a component placement part 41 in which the electronic component 8 is placed at a predetermined position, a supply head 42 which picks up the electronic component 8 from the component placement part 41 to hold it, a supply head moving mechanism 43 which moves the supply head 42 in the X direction, and a rotating mechanism 44 which rotates and slightly lifts or lowers the supply head 42.

The component placement part 41 comprises a component tray 411 on which a large number of electronic components 8 are placed, a stage 412 which holds the component tray 411, and a tray moving mechanism 413 which moves the component tray 411 with the stage 412 in the X and Y directions.

The large number of electronic components 8 to be mounted on the circuit board 9 are placed on the component tray 411 in an inverted position with respect to the position of the electronic components mounted on the circuit board 9, or in other words, in a position where the surface of the electronic components which faces downward when mounted, that is, the bonding surface on which an electrode part to be bonded to the circuit board 9 is formed, faces upward.

The supply head 42 comprises a supply collet 421 that supplies the electronic component 8, which has been hold by suction with a suction port formed at the tip end part, to the bonding tool 5.

The electronic component 8 may be an LED (light emitting diode) chip, a semiconductor light emitting element such as a semiconductor laser, a packaged IC (integrated circuit), a resistor, a capacitor, semiconductor such as a small semiconductor bare chip, a SAW (surface acoustic wave) filter, or an electronic component other than a semiconductor, such as a camera module.

The circuit board 9 may be a circuit board made of resin, or a circuit board made of a material other than resin, such as glass and a semiconductor.

The electrode part of the electronic component 8 may be a protruding bump of gold (Au) formed on an electrode pattern of the electronic component 8, a plating bump depending on the electronic component 8, or the electrode pattern itself.

A protruding bump, instead of the protruding bump formed on the electrode pattern of the electronic component 8, may be formed on an electrode on the circuit board 9.

The image pick-up part 11 is a unit that is provided immediately below the path of the component mounting part 31, in particular the bonding tool 5, which is moved by the mounting part moving mechanism 32, and picks up an image of the electronic component 8 held on the bonding tool 5 from the (−Z) side.

The image pick-up part 11 is provided at a position where the image pick-up part 11 does not interfere with the component mounting part 31 moved.

A polishing part 7, which polishes a tip end part 531 (see FIG. 3 here and in the following description) of the bonding tool 5 for holding the electronic component 8, is provided on the (+X) side of the circuit board 9.

The polishing part 7 is attached to the stage 21 on the (+X) side of the stage 21 and is moved along with the stage 21 in the Y direction by the stage moving mechanism 22.

The polishing part 7 comprises a sheet-like polishing member 71 having a flat horizontal polishing surface 711, and a polishing member holding part 72 which holds the polishing member 71.

Here, mainly referring to FIGS. 3 and 4, a configuration of the bonding tool 5 will be described in detail.

Figure 3:
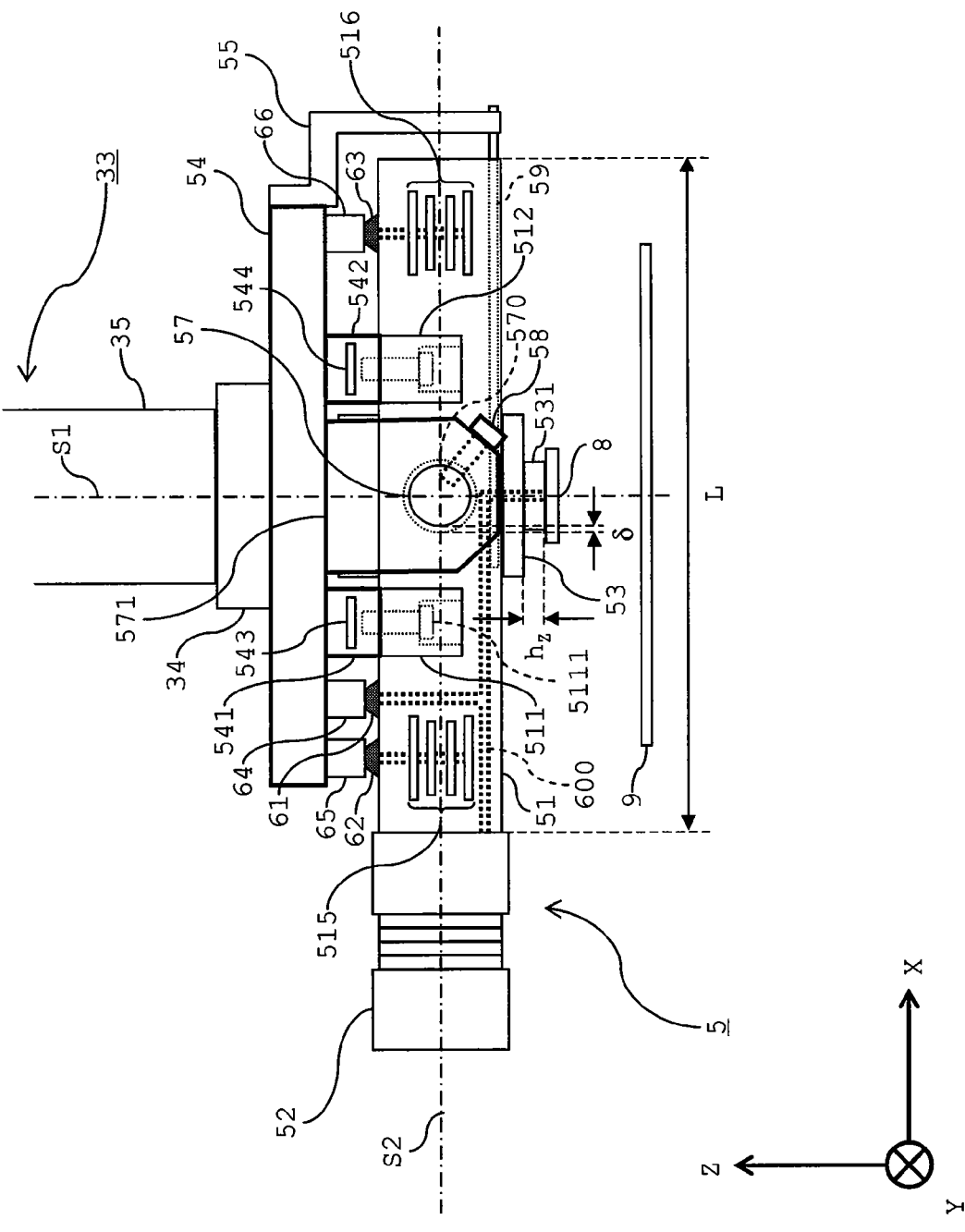
FIG. 3 is a schematic front view of a bonding tool according to the embodiment of the present invention.
Figure 4:
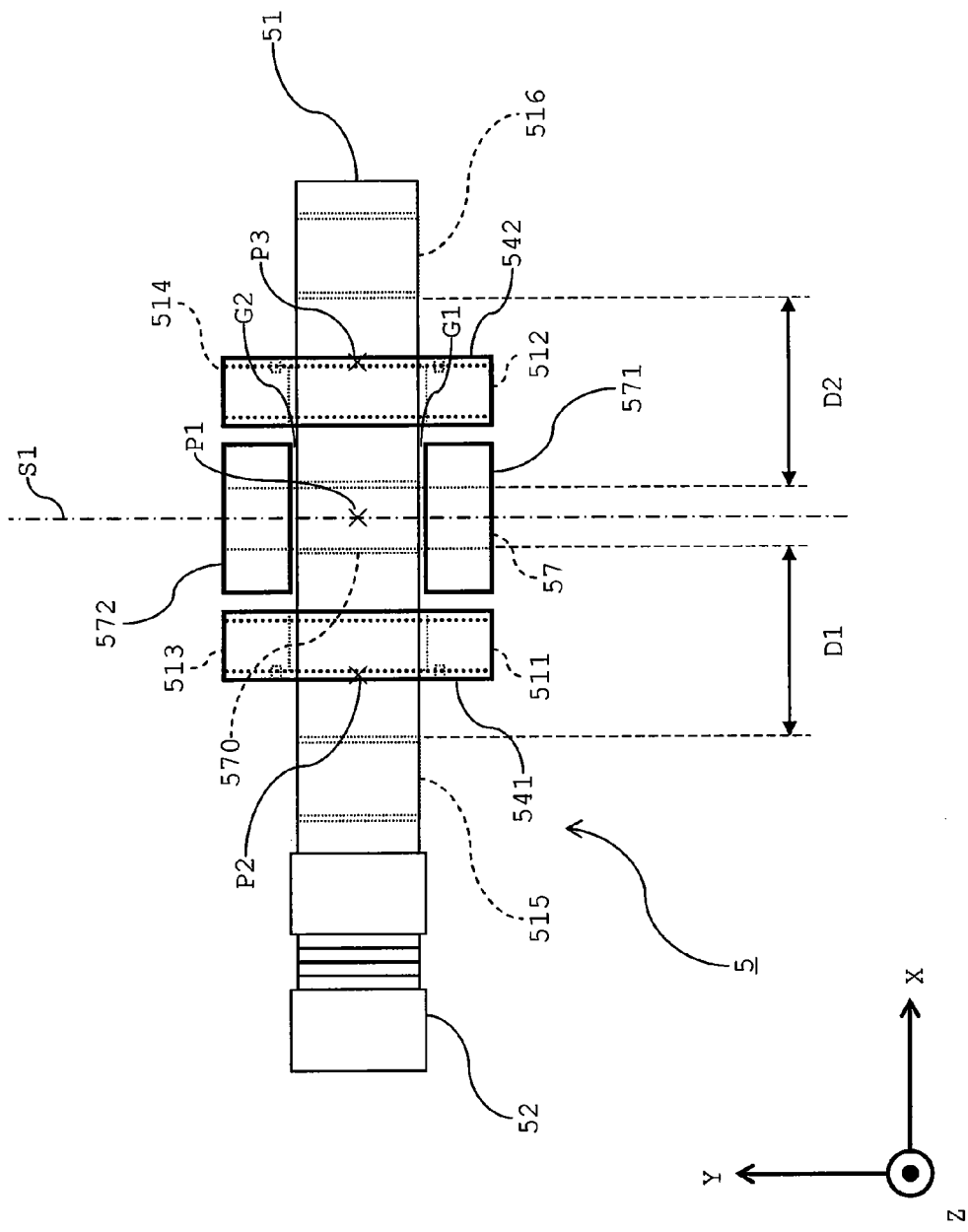
FIG. 4 is a schematic plan view of the bonding tool according to the embodiment of the present invention.

FIG. 3 is a schematic front view of the bonding tool 5 according to this embodiment of the present invention. FIG. 4 is a schematic plan view of the bonding tool 5 according to this embodiment of the present invention.

The bonding tool 5 comprises a horn 51, an ultrasonic transducer 52, a bonding action part 53, a heater disposition part 570, a first cooling part 515, and a second cooling part 516.

Further, the bonding tool 5 comprises a plate-like holder 54 disposed at the top thereof, a holder blocks 541 and 542 fixed to the holder 54, and heater holding blocks 571 and 572.

The plate-like holder 54 is coupled to a tool supporting part 34 located at the bottom end of the pressing unit 33. The tool supporting part 34 is fixed to the lower end of the shaft 35 of the pressing unit 33.

The horn 51 is a unit which transmits ultrasonic vibration. The horn 51 has a configuration in which it is in resonance at a predetermined frequency of the ultrasonic vibration. The horn 51 is substantially shaped like a prism of length L with a longitudinal direction agreeing with the X direction, which has a plane of symmetry S1 (i.e., a plane which divides the prism having a length L into two equal parts here in the following description) parallel with the YZ plane, and a plane of symmetry S2 parallel with the XY plane.

The horn 51 is shaped like a prism, as described above. However, the horn 51 may be shaped like a cylinder, for example.

The ultrasonic transducer 52 is a unit which is provided at one end of the horn 51 on the (−X) side and produces an ultrasonic vibration using a piezoelectric element (not shown).

The ultrasonic vibration produced by the ultrasonic transducer 52, as a longitudinal vibration which has the propagation direction of the X direction with the vibration direction of the medium in parallel with the propagation direction, is transmitted to the bonding action part 53 which is located at the middle of the bottom surface of the prism.

A point P1 is a point which indicates a position in the X direction, which corresponds to an antinode at which the amplitude of the ultrasonic vibration in resonance is maximized. The ultrasonic vibration in this embodiment has two nodal points, and a point P2 nearer to the one end of the horn 51 on the (−X) side and a point P3 nearer to the other end of the horn 51 on the (+X) side are points which indicate positions in the X direction, which correspond to nodes at which the amplitude of the ultrasonic vibration in resonance is approximately 0. The point P1 lies on the plane of symmetry S1, and the points P2 and P3 are approximately symmetrical to each other with respect to the plane of symmetry S1.

The ultrasonic vibration produced by the ultrasonic transducer 52 is transmitted through the horn 51 in the X direction and applied to the electronic component 8 via the bonding action part 53.

Here, mainly referring to FIGS. 3, 4 and 5, a configuration of the heater disposition part 570 will be described in detail.

Figure 5:
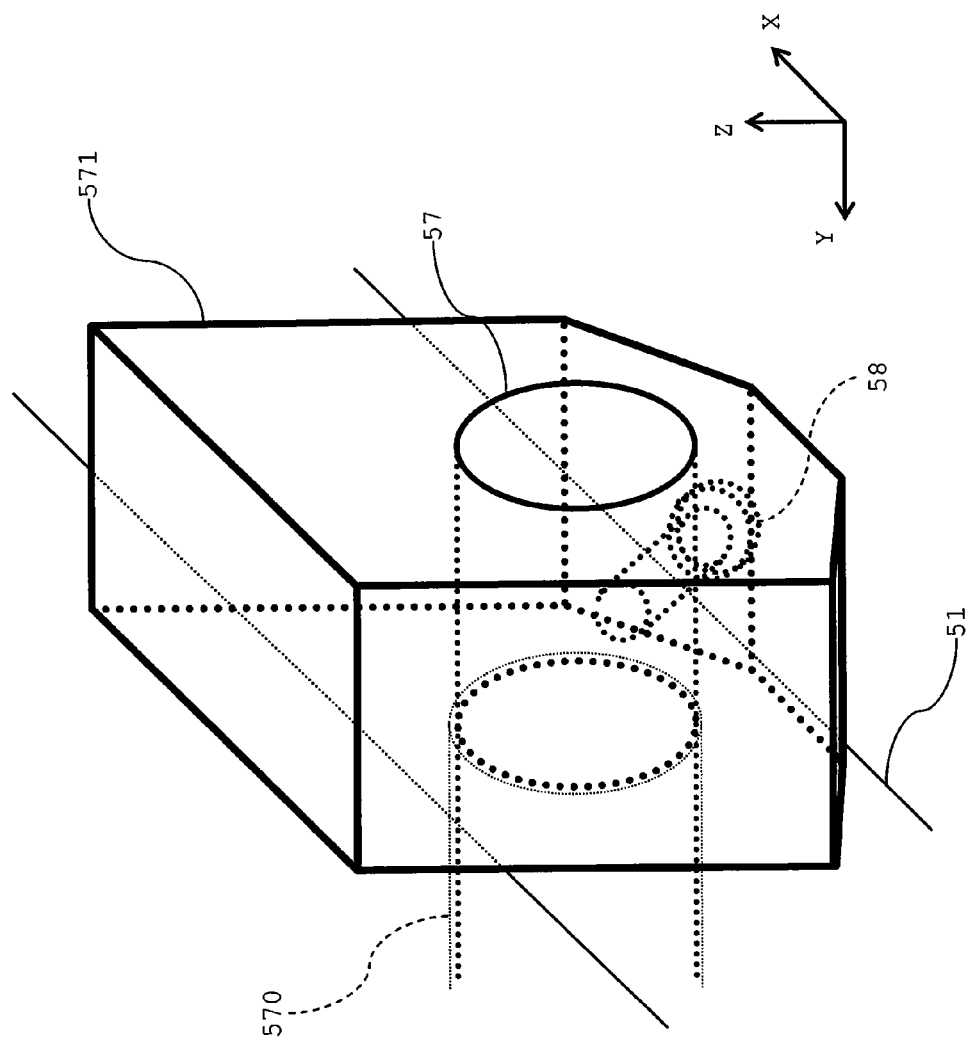
FIG. 5 is a schematic perspective view of a heater disposition part and its vicinity of the bonding tool according to the embodiment of the present invention.

FIG. 5 is a schematic perspective view of the heater disposition part 570 of the bonding tool 5 and its vicinity according to this embodiment of the present invention.

The heater disposition part 570 is a part which is provided between the one end of the horn 51 on the (−X) side and the other end of the horn 51 on the (+X) side, a heater 57 being inserted into and disposed in the part.

The heater disposition part 570 is approximately symmetrical with respect to the plane of symmetry S1 and with respect to the plane of symmetry S2. More specifically, the heater disposition part 570 is a heater insertion hole, which is provided immediately above, or in other words, on the (+Z) side of, the bonding action part 53 heated by the heater 57 and penetrates the horn 51 in the Y direction perpendicular to the X direction in which the ultrasonic vibration is transmitted.

The heat at approximately 250° C. generated by the heater 57 is transmitted through the horn 51, and the heat is applied to the electronic component 8 via the bonding action part 53.

The heater 57 is disposed away from the wall of the above-described heater insertion hole with a predetermined clearance 5.

The both ends of the heater 57 are fixed to the heater holding blocks 571 and 572 with a heater fixing screw 58. The heater holding blocks 571 and 572 are fixed to the lower surface of the holder 54 coupled to the external pressing unit 33. The heater holding blocks 571 and 572 here are fixed to the lower surface of the holder 54 with predetermined gaps G1 and G2, respectively, away from the horn 51.

Owing to this configuration, the heater 57 is not in contact with the horn 51 and thus there is no fear that the heater 57 has an adverse effect on the characteristics of the ultrasonic vibration, even though the heater 57 is not disposed in the transmission direction of the ultrasonic vibration but is disposed in the direction perpendicular to the transmission direction.

More specifically, concerning the above-described conventional bonding tool, the horn 1200 is shaped like a prism with a longitudinal direction agreeing with the X direction in which the ultrasonic vibration is transmitted, and the heater 1600 is inserted, from the (+X) side, into the heater installation cavity part 1610 penetrating the horn 1200 in the X direction.

As for the configuration of such a conventional bonding tool, although the heater 1600 is in direct contact with the horn 1200, there is little fear that the insertion of the heater 1600 itself causes a variation of the vibration characteristics. This is because, since the inner diameter of the heater installation cavity part 1610 is approximately equal to the outer diameter of the heater 1600 and displacement of the heater 1600 slid for the ultrasonic vibration is thus restricted substantially within the X direction in which the heater installation cavity part 1610 penetrates the horn 1200, the ultrasonic vibration transmitted in the X direction is not significantly affected by the displacement of the heater 1600. Of course, the configuration of the above-described conventional bonding tool has disadvantages, such as difficulty in replacing the heater 1600. However, the common belief among those skilled in the art is that it is necessary to adopt the configuration in which the heater 1600 is inserted into the heater installation cavity part 1610 penetrating the horn 1200 in the X direction in which the ultrasonic vibration is transmitted, in order to avoid the fear that the insertion of the heater 1600 itself causes a variation of the vibration characteristics.

Needless to say, in the case where such a conventional configuration is adopted, there is no space for a cooling part between the heater 1600 and the other end of the horn 1200 on the (+X) side because of the presence of the heater installation cavity part 1610.

Here, the magnitude of the clearance δ will be specifically described.

When the heating is carried out, the horn 51 and the heater 57 expand, so the clearance δ decreases.

Therefore, the clearance δ is set to be approximately 0.05 mm in the non-heating state, taking into account the expansion of the horn 51 and the heater 57 during the heating state.

More specifically, the decrease of the clearance δ due to the expansion in the heating state is at most approximately 0.01 mm on each side of the horn 51 and the heater 57, and thus at most approximately 0.02 mm in total. The amplitude of the ultrasonic vibration is at most approximately 0.003 mm. Therefore, the clearance δ set to be approximately 0.05 mm in the non-heating state is enough to prevent the heater 57 from colliding with the horn 51 when the electronic component 8 is mounted on the circuit board by ultrasonic vibration and heating.

Of course, despite the presence of the clearance δ, heating is achieved without any problem owing to heat radiation or heat convection, but an excessively large clearance δ may reduce the heating efficiency.

Thus, when an inexpensive cartridge heater is used as the heater 57, the clearance δ is desirably set to be approximately 0.02 to 0.2 mm, also taking into account the manufacturing precision of current cartridge heaters.

Of course, the clearance δ can be filled with a gel material or the like which is not considered to leak or cause a change of the vibration mode. Alternatively, the clearance δ may be filled with highly elastic material such as a rubber.

In this embodiment, since a configuration is adopted in which the horn 51 is shaped like a prism with a longitudinal direction agreeing with the X direction and the heater insertion hole penetrates the horn 51 in the Y direction perpendicular to the X direction, replacement of the heater 57 needed due to a failure or the like is fairly easy.

In addition, since a configuration is adopted in which the heater disposition part 570 is disposed to be approximately symmetrical with respect to the plane of symmetry S1, the symmetry of the temperature distribution in the X direction in the heating state is improved.

A thermocouple 59 fixed by a thermocouple fixing plate 55 is a unit which measures the temperature of the bonding action part 53 to perform highly precise temperature control.

The bonding action part 53 is a unit, which is provided between the one end of the horn 51 on the (−X) side and the other end of the horn 51 on the (+X) side, holds the electronic component 8, and is heated by the heater 57. The bonding action part 53 is provided to be approximately symmetrical with respect to the plane of symmetry S1 of the horn 51. More specifically, the bonding action part 53 is provided, at the point P1 in the X direction, on the lower surface of the horn 51, which is the surface on the (−Z) side of the two surfaces of the horn 51 parallel with the XY plane.

The bonding action part 53 is made of stainless steel which has preferred vibration characteristics and vibration transmission characteristics, and has the tip end part 531 for holding the electronic component 8 by suction with a suction path 600. The tip end part 531 is shaped like a column of height $h_z$ in the Z direction designed not to cause flexural vibration, with a cross section being optimum for the size and type of the electronic component 8.

Here, mainly referring to FIG. 6, a configuration of the suction path 600 will be described in detail.

Figure 6:
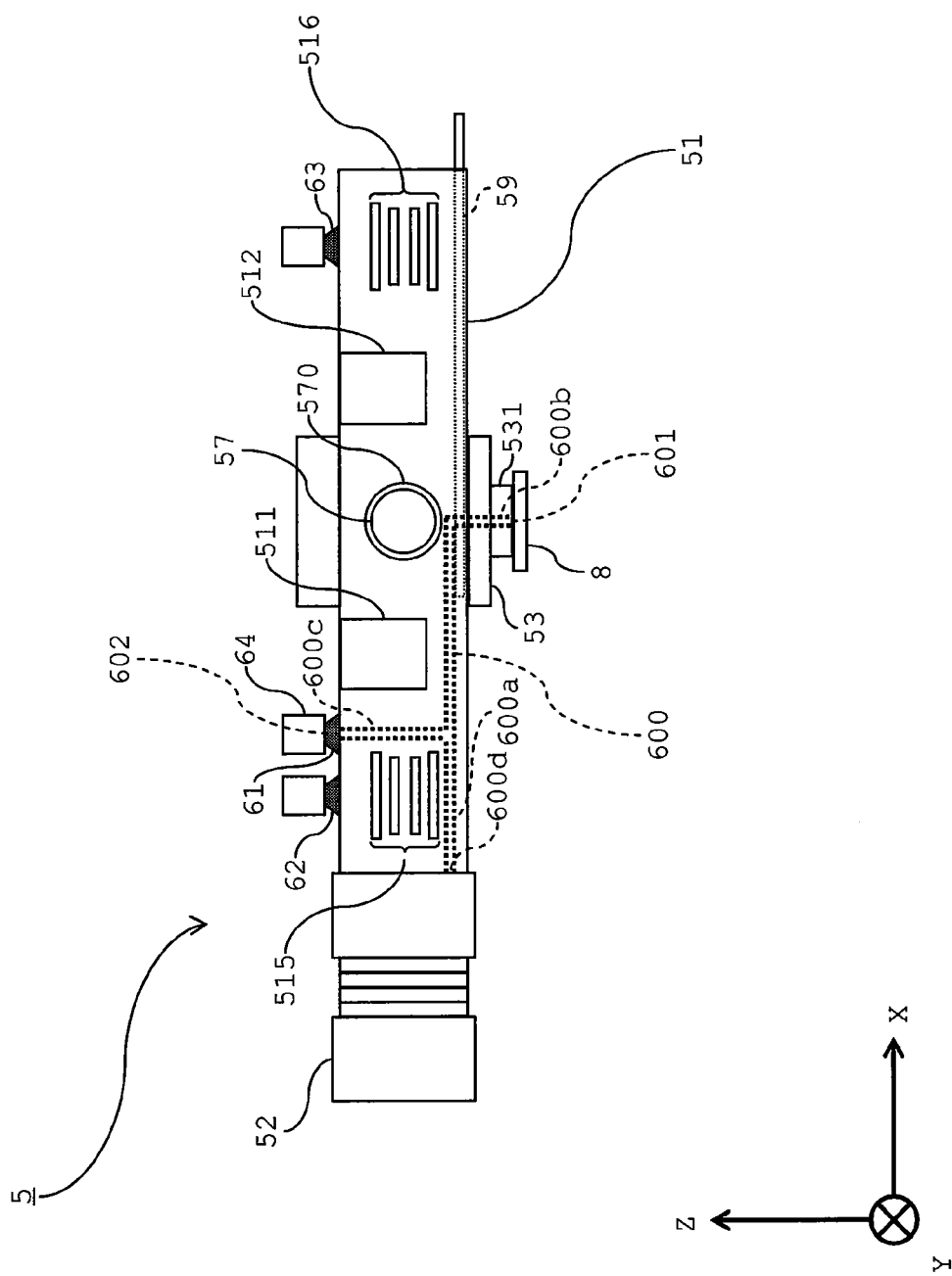
FIG. 6 is a schematic front view of a suction path and other components of the bonding tool according to the embodiment of the present invention.

FIG. 6 is a schematic front view of the bonding tool 5 according to this embodiment of the present invention, with the holder 54, the holder blocks 541 and 542, and the heater holding blocks 571 and 572 being excluded.

The suction path 600 has an exhaust port 602 formed in the upper surface of the horn 51, a suction port 601 formed in the tip end part 531, a horizontal hole 600a which is a part of the suction path 600, a vertical hole 600b which connects the suction port 601 to the horizontal hole 600*a*, and a vertical hole 600*c* which connects the exhaust port 602 to the horizontal hole 600*a*. The suction path 600 is, when the short vertical hole 600*b* is ignored, substantially shaped like the letter T.

The horizontal hole 600*a*, which is a part of the suction path 600, is a hole bored from a part of the one end of the horn 51 on the (−X) side, against which the ultrasonic transducer 52 is to abut. In this embodiment, since the ultrasonic transducer 52 abuts against the opening 600*d* of the above-described horizontal hole, any member to ensure vacuum, such as a plug, is not needed.

The suction port 601 of the suction path 600 for holding the electronic component 8 by suction is formed substantially at the middle of the lower surface of the tip end part 531 of the bonding action part 53 for holding the electronic component 8 by suction, which is parallel with the XY plane.

The exhaust port 602 of the suction path 600 is formed at a position nearer to the one end of the horn 51 on the (−X) side than the other end of the horn 51 on the (+X) side, in the upper surface of the horn 51 on the (+Z) side of the two surfaces parallel with the XY plane.

The exhaust port 602 is connected, via a suction pad 61 made of silicone resin or the like connected to a highly heat-resistant tube 64, through the holder 54 and the tool supporting part 34, to a vacuum pump (not shown).

Since the first cooling part 515 is provided at a position nearer to the one end of the horn 51 on the (−X) side and the vertical hole 600*c* passes in the vicinity of the first cooling part 515, the fear that the suction pad 61 and the tube 64 are deteriorated due to the heat generated by the heater 57 is reduced.

The exhaust port 602 of the suction path 600 is, as described above, formed at a position nearer to the one end of the horn 51 on the (−X) side than the other end of the horn 51 on the (+X) side, in the upper surface of the horn 51 on the (+Z) side of the two surfaces parallel with the XY plane.

Figure 7:
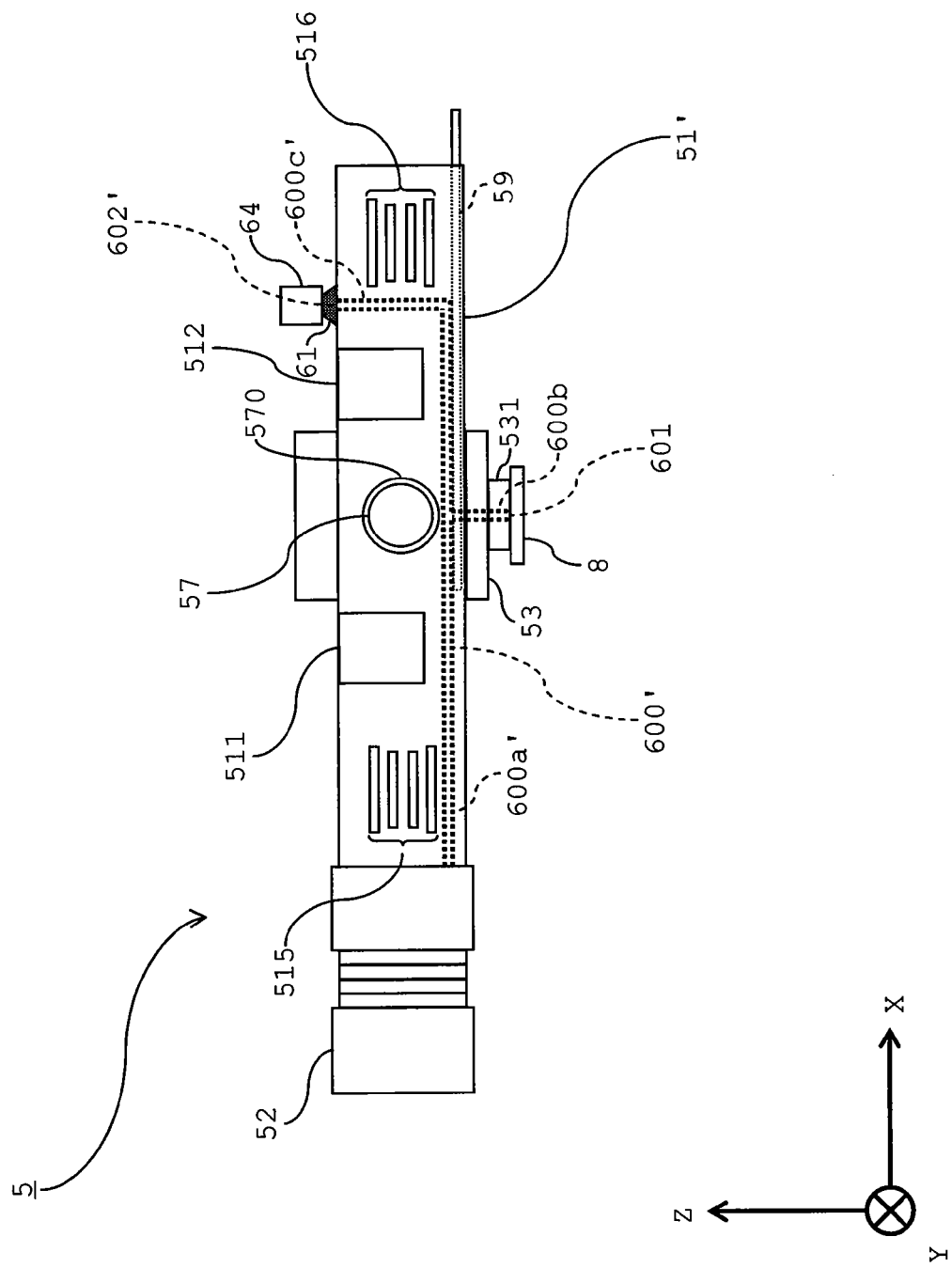
FIG. 7 is a schematic front view of a suction path and other components of the bonding tool according to another embodiment of the present invention.

Alternatively, as shown in FIG. 7, in a bonding tool 5 according to another embodiment of the present invention, an exhaust port 602' of a suction path 600' may be formed at a position nearer to the other end of a horn 51' on the (+X) side than the one end of the horn 51' on the (−X) side, in the upper surface of the horn 51' on the (+Z) side of the two surfaces parallel with the XY plane. Since the second cooling part 516 is provided at a position nearer to the other end of the horn 51' on the (+X) side and a vertical hole 600*c*' passes in the vicinity of the second cooling part 516, again, the fear that the suction pad 61 and the tube 64 are deteriorated due to the heat generated by the heater 57 is reduced. However, since it goes without saying that the horizontal hole 600*a*' can be bored easily when it is short, in the case where such a configuration is adopted, the length of a horizontal hole 600*a*' has to be prevented from being too long.

Figure 8:
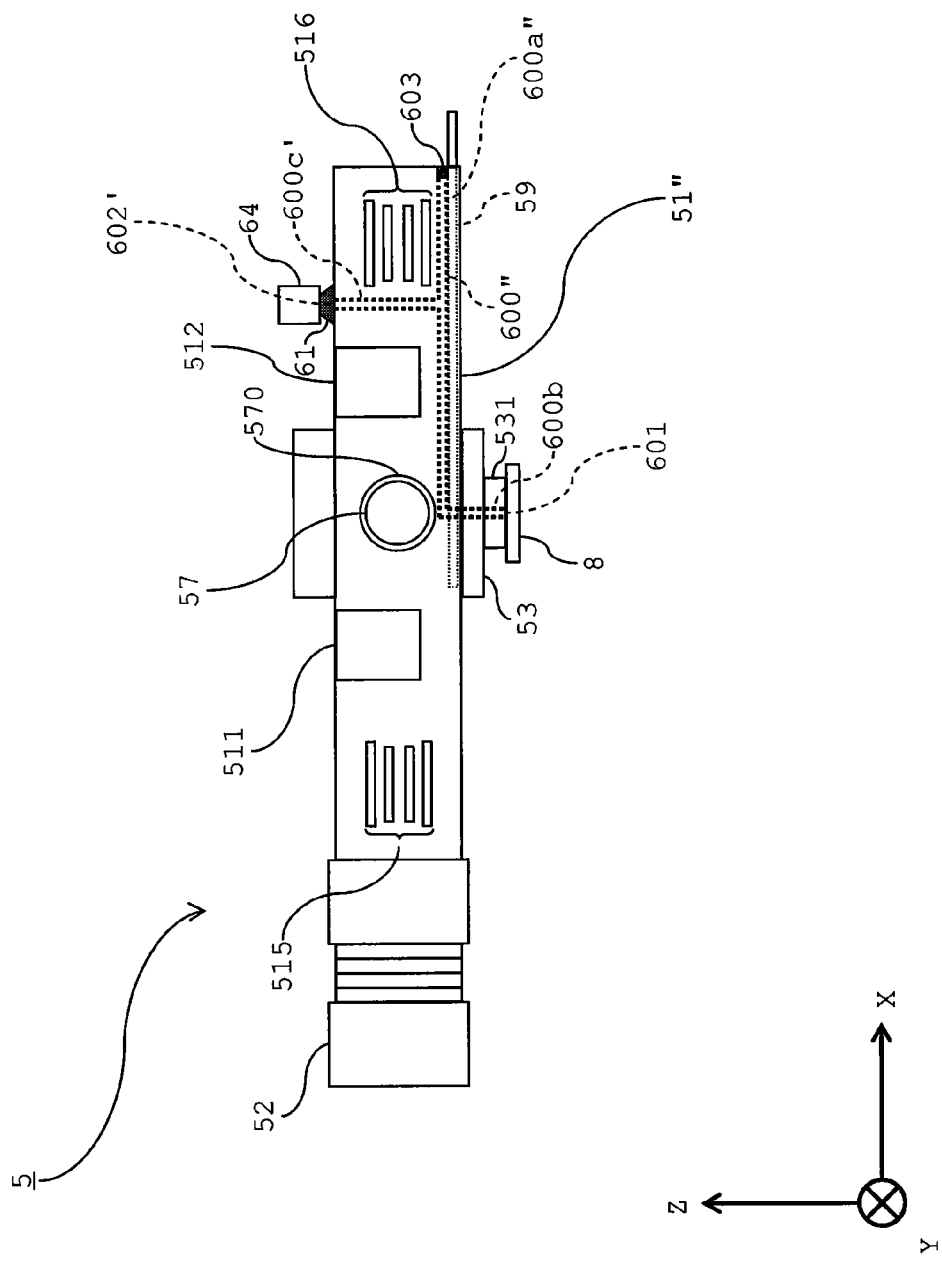
FIG. 8 is a schematic front view of a suction path and other components of the bonding tool according to still another embodiment of the present invention.

Furthermore, the horizontal hole 600*a*' which is a part of the suction path 600' is, as described above, a hole bored from a part of the one end of the horn 51' on the (−X) side, against which a ultrasonic transducer 52' is to abut. Alternatively, as shown in FIG. 8, in a bonding tool 5 according to still another embodiment of the present invention, a horizontal hole 600*a*", which is a part of a suction path 600", may be a hole bored from the other end of a horn 51" on the (+X) side. However, in the case where such a configuration is adopted, a member to ensure vacuum, such as a plug 603, is needed.

Next such configuration that is necessary for the pressing unit 33 pressing with holding the horn 51 is described.

The horn holding blocks 511,512,513 and 514 are a unit by which the pressing unit 33 presses with holding the horn 51, and are provided on the right and left side surfaces of the horn 51 with two for each surface, the side surface being parallel to XZ plane of the horn 51. More concretely the horn holding blocks 511, 512 are provided on the (−Y) side surface among two surfaces of the horn 51 parallel to the XZ plane and the horn holding blocks 513, 514 are provided on the (+Y) side surface among two surfaces of the horn 51 parallel to the XZ plane.

Further the horn holding blocks 511,513 are provided on a basis of the point P2 as a position reference with regard to X direction and the horn holding blocks 512,514 are provided on a basis of the point P3 as a position reference with regard to X direction.

The horn holding blocks 511,513 are fixed to the holder block 541 and the horn holding blocks 512,514 are fixed to the holder block 542. The holder blocks 541,542 are fixed to the lower surface of the holder 54 as described above.

Then the holder block 541 has holder block air hole 543 and the holder block 542 has holder block air hole 544. And the holder block air holes 543,544 which are slit-like shaped and through which air flows, penetrate through the holder blocks 541,542 respectively in the Y direction which is perpendicular to a X direction in which the ultrasonic vibration is transmitted. The holder block air holes 543,544 radiate heat generated by the heater 57 and absorb or damp such shift of the position of the nodal point caused by load, temperature and so on change while the pressing.

Then the horn holding blocks 511,512,513,514 have similar configuration. Therefore the one configuration of the horn holding block 511 is described in detail referring mainly FIGS. 9 and 10.

Figure 9:
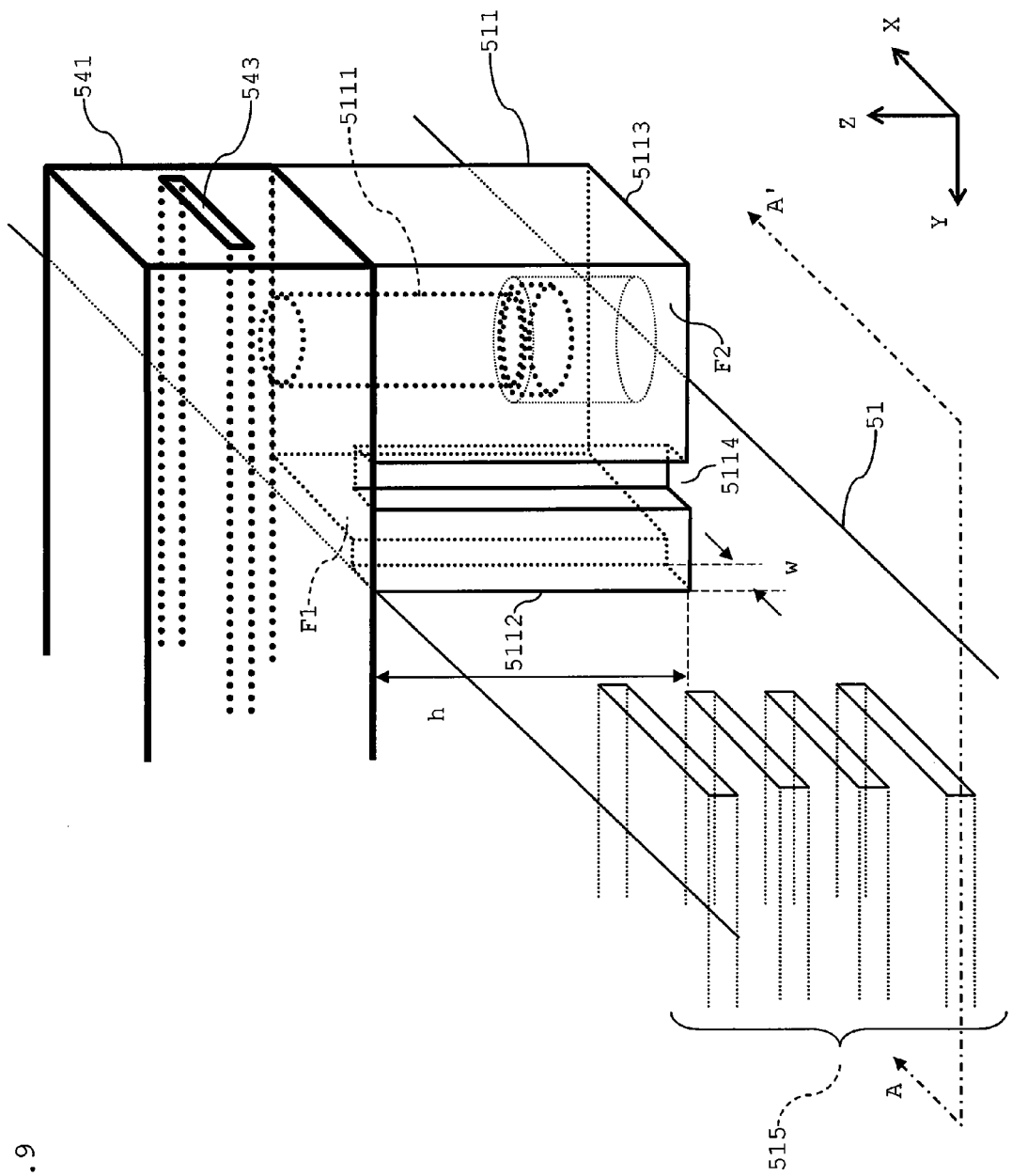
FIG. 9 is a schematic perspective view of a horn holding block and its vicinity of the bonding tool according to the embodiment of the present invention.
Figure 10:
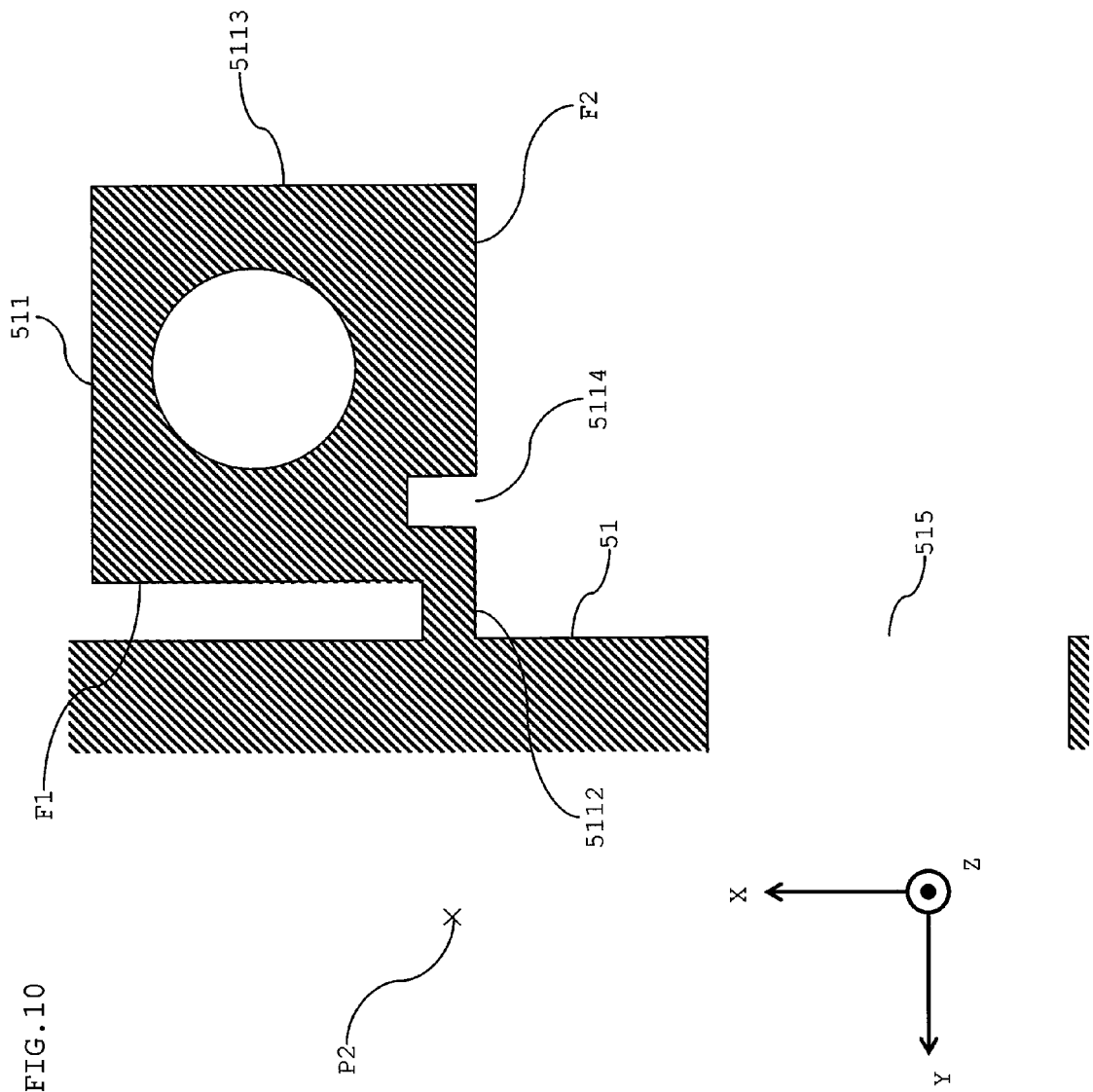
FIG. 10 is a schematic cross-sectional view of the horn holding block and its vicinity of the bonding tool according to the embodiment of the present invention.

FIG. 9 is a schematic perspective view of a horn holding block 511 and its vicinity of the bonding tool 5 according to the embodiment of the present invention. And FIG. 10 is a schematic cross-sectional view of the horn holding block 511 and its vicinity of the bonding tool 5 according to the embodiment of the present invention.

The horn holding block 511 has rib 5112 provided, on a basis of the point P2 as a position reference, on the (−Y) side surface among two surfaces of the horn 51 parallel to the XZ plane, and has main body 5113 connected to the rib 5112. The main body 5113 has groove 5114 formed in long distance direction of the rib 5112, adjacent to the rib 5112. The horn holding block 511 is fixed to the holder block 541 by using horn fixing screw 5111 which is inserted in a hole penetrating the main body 5113 in the lengthwise direction.

The long distance direction of the rib 5112 is Z direction which is perpendicular to the X direction in which the ultrasonic vibration is transmitted, and further the long distance direction is such direction which is perpendicular to the lower surface of the (−Z) side among two surfaces of the horn 51 parallel to the XY plane. The rib 5112 is provided at the edge in the (−X) direction side of the surface F1 of the main body 5113, the surface F1 opposed to the horn 51.

The shape of the rib 5112 is substantially thin prism which has height h in the Z direction as said long distance direction and width w in the X direction as the widthwise.

Then height h and width w are concretely described.

It is preferable that the height h is designed as large as can considering the physical properties of the horn 51. The reason is that it is necessary to get enough hardness to transmit the pressure while standing up to the pressing load with regard to the Z direction in which the press unit 33 presses the electronic component 8. In the present embodiment the horn holding blocks 511,512,513 and 514 are provided on the both side surfaces of the horn 51 with two for each surface, the side surface being parallel to XZ plane of the horn 51 and ribs of enough number which have similar configuration to that of the rib 5112, are provided, and therefore such hardness is obtained that can stand up to the pressing load according to the increase of the size or number of the electronic component 8.

It is preferable that the width h is designed as small as can considering the physical properties of the horn 51. The reason is that it is necessary to get enough degree of freedom to make the electronic component 8 vibrate by the ultrasonic vibration with regard to the X direction in which the ultrasonic vibration is transmitted. Of course the groove 5114 is a configuration for getting larger degree of freedom.

Figure 11:
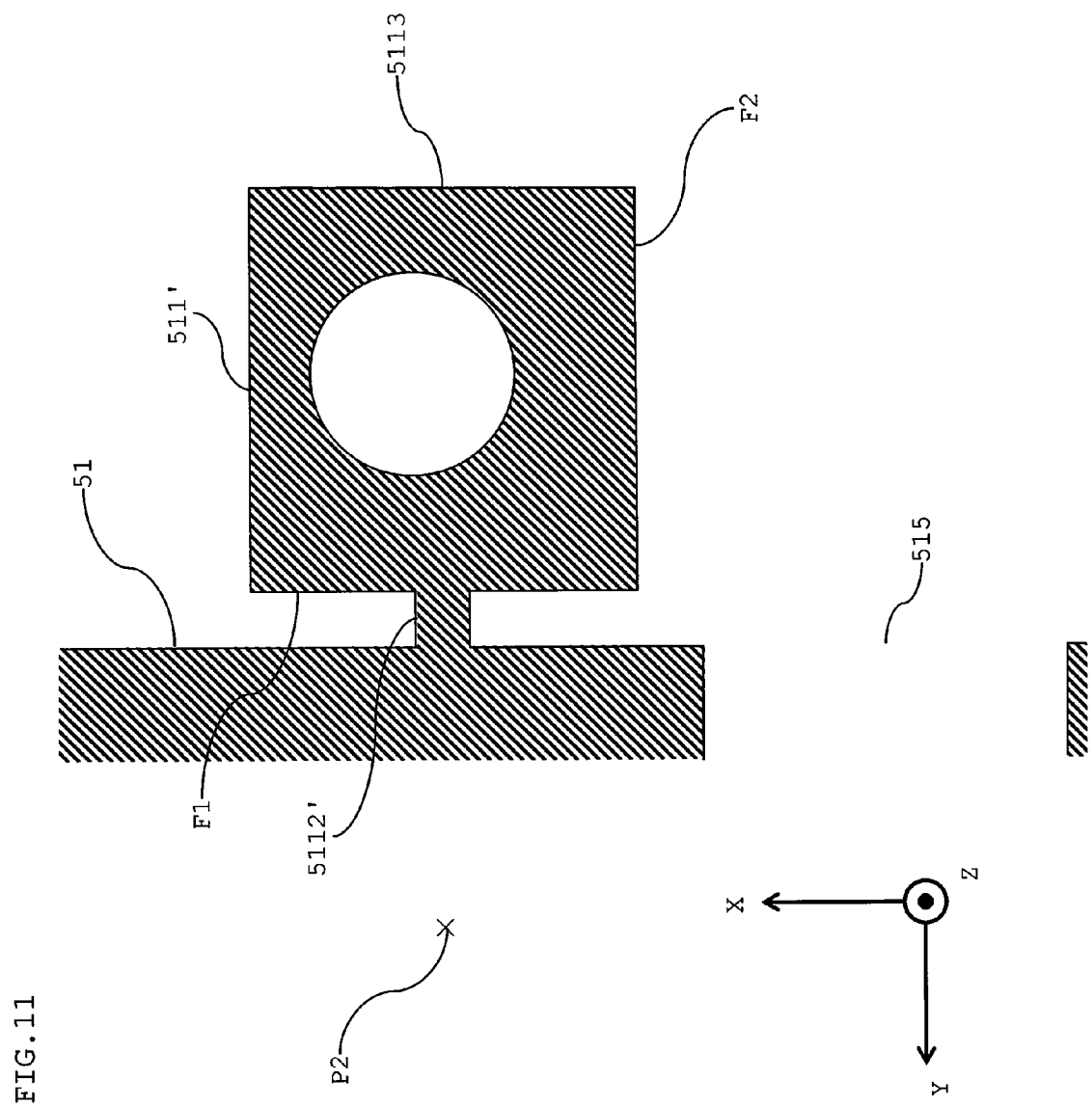
FIG. 11 is a schematic cross-sectional view of a horn holding block and its vicinity of the bonding tool according to another embodiment of the present invention.

Then rib 5112 is provided at the edge in the (−X) direction side of the surface F1 as described above. But as shown in FIG. 11 a rib 5112' can be provided at the central part of surface F1 of the main body 5113. In this case since the rib 5112' is preferable to be provided using the point P2 as a reference. Therefore under such configuration it is necessary to make the horn holding block 511' not covering largely the opening of the air hole of the first cooling part 515, thereby to get enough area of the opening.

Of course in order to avoid such state that the heat generated by the heater 57 is transmitted far and wide, such configuration is useful that the first cooling part 515 is provided between the point P2 and heater 57. Then when the above configuration is realized, a rib which has similar constitution as that of the rib 5112' can be provided at the edge in the (+X) direction side of the surface F1.

Figure 12:
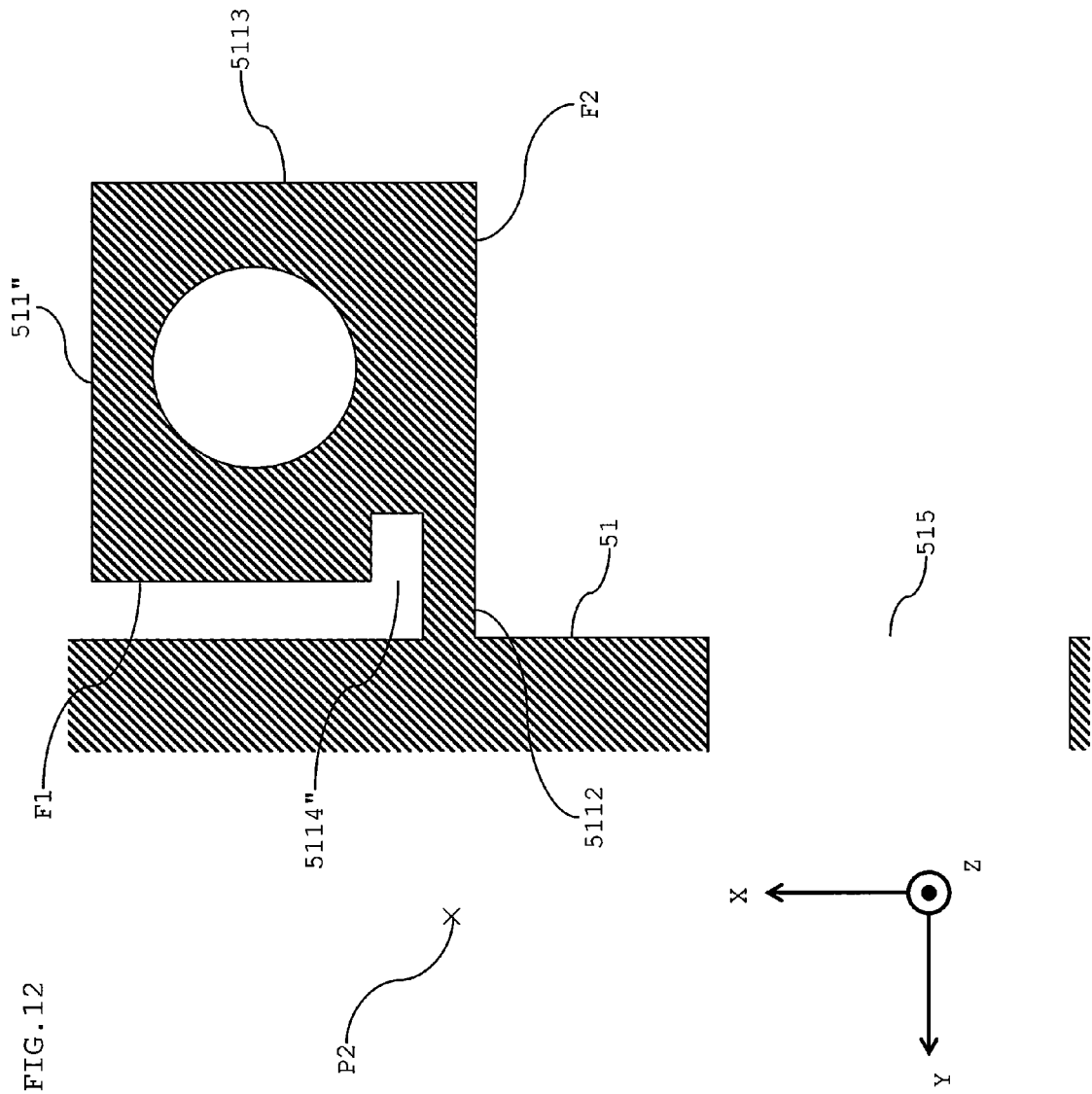
FIG. 12 is a schematic cross-sectional view of a horn holding block and its vicinity of the bonding tool according to still another embodiment of the present invention.

And the groove 5114 is provided at the edge of the surface F2 of the main body 5113 as described above, which is adjacent to the surface F1. But a groove 5114' can be provided at the edge of the surface F1 of the main body 5113 as shown in FIG. 12. Even under such configuration enough degree of freedom for vibrating the electronic component 8 by the ultrasonic vibration with regard to the X direction, can be obtained.

Next the first cooling part and second cooling part 515,516 are described. As shown in FIG. 3 and FIG. 4 the first cooling part 515 is provided between the heater disposition part 570 and an edge of the (−X) direction side of the horn 51 and an air flows therein. More concretely the first cooling part 515 penetrates the horn 51 in the Y direction which is perpendicular to the X direction in which the ultrasonic vibration is transmitted, and has four slit shaped air holes through which air flows, the four holes being provided as approximately symmetrical to each other with respect to the plane of symmetry S2.

The second cooling part 516 is provided between the heater disposition part 570 and an edge of the (+X) direction side of the horn 51 and an air flows therein. More concretely the second cooling part 516 also penetrates the horn 51 in the Y direction which is perpendicular to the X direction in which the ultrasonic vibration is transmitted, and has four slit shape air holes through which air flows, the four holes provided as approximately symmetrical to each other with respect to the plane of symmetry S2.

And the first cooling part 515 and the second cooling part 516 are provided approximately symmetrical to each other with respect to the plane of symmetry S1. More concretely the distance D1 between the heater disposition part 570 and the first cooling part 515 is equal to the distance D2 between the heater disposition part 570 and the second cooling part 516.

The first cooling part 515 is provided between the edge of the (−X) direction side of the horn 51 and the horn holding blocks 511,513 which are near the edge of the (−X) direction side of the horn 51. Further the second cooling part 516 is provided between the other edge of the (+X) direction side of the horn 51 and the horn holding blocks 512,514 which are near the other edge of the (+X) direction side of the horn 51.

Further the first cooling part 515 is provided between the edge of the (−X) direction side of the horn 51 and the point P2 which is near the edge of the (−X) direction side of the horn 51. Further the second cooling part 516 is provided between the other edge of the (+X) direction side of the horn 51 and the point P3 which is near the other edge of the (+X) direction side of the horn 51.

In summary the first cooling part 515 and the second cooling part 516 are provided separately and independently to each other, with each being provided at a part between the heater disposition part 570 and an edge of the (−X) direction side of the horn 51, and another part between the heater disposition part 570 and the other edge of the (+X) direction side of the horn 51. Further they are provided as approximately symmetrical to each other with respect to the plane of symmetry S2.

As a result it is considerably suppressed that the horn 51 expands when heated, asymmetrically with respect to the X direction which is the longitudinal direction of the horn 51, and therefore the possibility can be decreased that the expansion leads to a deviation of the direction or amplitude of the vibration of the held electronic component 8 from the designed value and to a change of the vibration mode.

Therefore the electronic component mounting apparatus 1 can realize stable bonding of electronic components.

Figure 13:
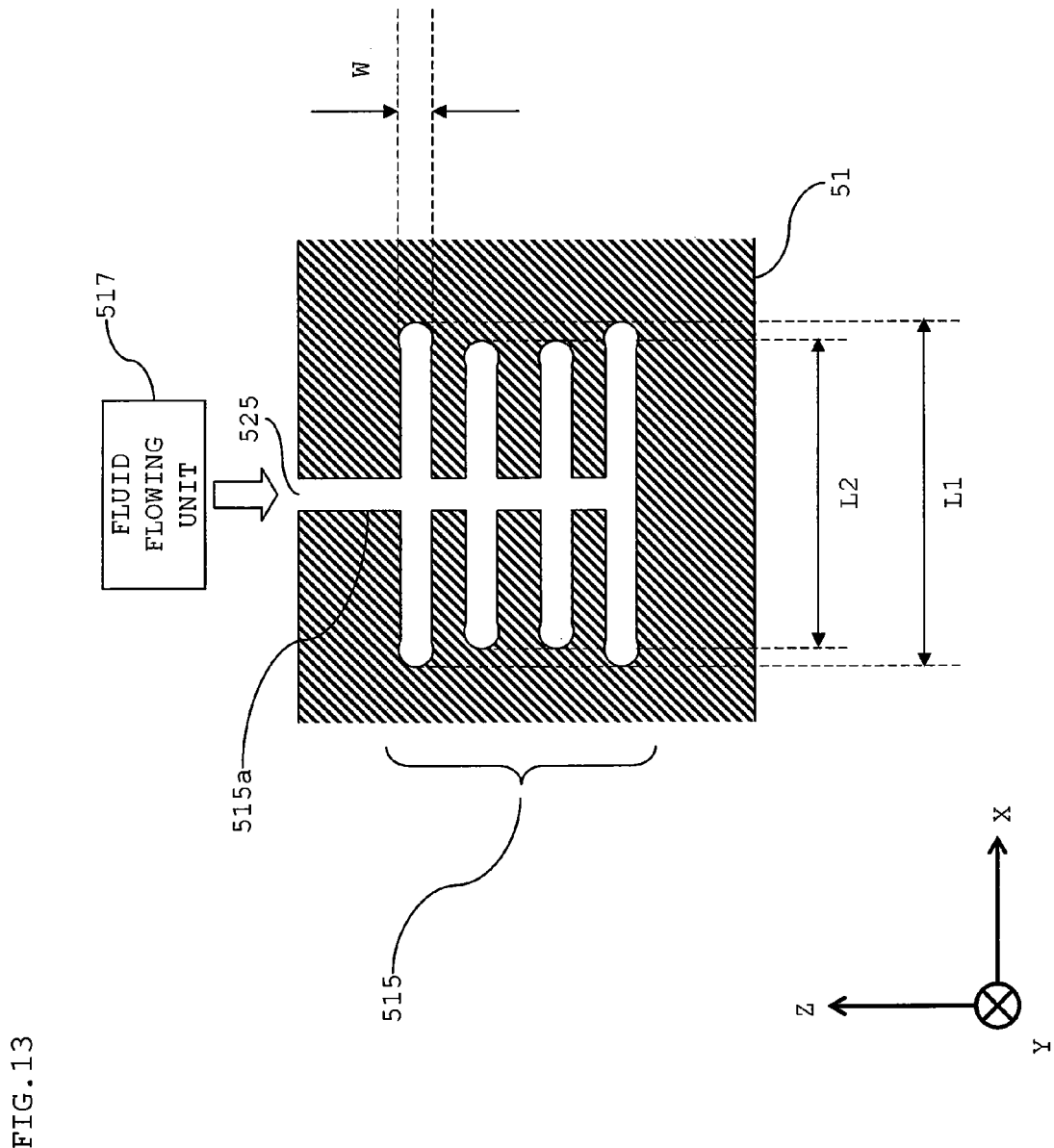
FIG. 13 is a schematic cross-sectional view of a first cooling part of the bonding tool according to the embodiment of the present invention.

Here since the inner configurations of the first cooling part 515 and the second cooling part 516 are similar and then the configuration of the first cooling part 515 is described in detail referring mainly FIG. 13.

Then FIG. 13 is a schematic cross-sectional view of the first cooling part 515 of the bonding tool 5 according to the embodiment of the present invention.

Each of the four slit shaped air holes through which air flows is formed by such a wire cut processing method that wire is firstly inserted into a hole which is penetrated in a direction perpendicular to the right and left side surfaces and by utilizing the inserted wire a slit is bored in the ultrasonic vibration transmit direction.

And a longitudinal hole 515a connects the four slit shaped air holes through which air flows with an air hole 525 by which a fluid flowing unit 517 provided outside makes air flow.

Each of the four air holes is shaped like a thin width rectangular with a longitudinal direction agreeing with the X direction in which the ultrasonic is transmitted.

Each rectangular air hole has a width W in the Z direction as the width direction and (1) two rectangular holes which are near to the two planes of the horn 51 being parallel to the XY plane have length L1 in the X direction as the longitudinal direction and (2) the remaining two rectangular holes which are disposed between the two rectangular holes of the above (1), have length L2(<L1) in the X direction as the longitudinal direction.

Of course in order to efficiently radiate the heat generated by the heater 57 it is preferable to make the area W×L1 and W×L2 of the rectangular hole large to some extent.

As described above in the present embodiment the rib 5112 is provided at the edge of the surface F1 in the (−X) direction side and therefore the length L1 and L2 can be designed as large as enough without such risk that the horn holding block 511 covers the opening of the air hole of the first cooling part 515.

However it is also preferable not to make the area large very much because too large area W×L1 and W×L2 of the rectangular hole changes the characteristic of the vibration or decreases the hardness of the horn 51.

Then the width W and length L are described more concretely.

Firstly the width W is desirable to be designed not to become too large with considering the physical properties of the horn 51. The reason is that it is necessary to make the air flow through the air hole to some extent in order to radiate efficiently the heat generated by the heater 57. That is when the width is too large, the velocity of the flow of the air becomes small and when the velocity of the flow becomes small, the heat radiation to the outside becomes less.

Next the length L1 and L2 is desirable to be designed not to become too large, considering the physical properties of the horn 51. Concretely the length L1 and L2 is desirable to be 20 percent or less of the length L which is whole length of the horn 51. The reason is that too large length L1 and L2 makes resonance points of the ultrasonic vibration increase and sub-resonance occurs near the resonance pint and thereby the control of the vibration characteristic becomes difficult. Here in the present embodiment the length L2 is shorter than the length L1. The reason is that the generation of the above mentioned sub-resonance becomes remarkable at such position (central position) which is far from the two surfaces parallel to the XY plane.

The fluid flowing unit 517 which makes air flow through the first cooling part 515 and the second cooling part 516 is provided outside.

As shown in FIG. 3 the fluid flowing unit 517 is connected to the first cooling part 515 and the second cooling part 516 via a suction pad 62 made of silicon resin or the like, connected to a highly heat-resistant tube 65 and via a suction pad 63 made of silicon resin or the like, connected to a highly heat-resistant tube 66 respectively.

As the result the heat generated by the heater 57 is more efficiently radiated and it is decreased that the expansion of the horn 51 at heating becomes asymmetrically with respect to the X direction which is the longitudinal direction of the horn 51. And therefore the risk possibility can be more decreased that the expansion leads to a deviation of the direction or amplitude of the vibration of the held electronic component 8 from the designed value and to a change of the vibration mode.

Therefore the electronic component mounting apparatus 1 can realize stable bonding of electronic components.

Then air flows through the first cooling part 515 and the second cooling part 516 as above described. But liquid cooling media like water can be allowed to flow through the first cooling part 515 and the second cooling part 516, by utilizing a cycle pipe connected to a radiator.

As described above the fluid flowing unit 517 is provided outside as a common unit for distributing air to the first cooling part 515 and the second cooling part 516. But another fluid flowing unit having similar configuration to that of the fluid flowing unit 517 can be independently provided, and thereby fluids can flow separately through the first cooling part 515 and the second cooling part 516.

Figure 2:
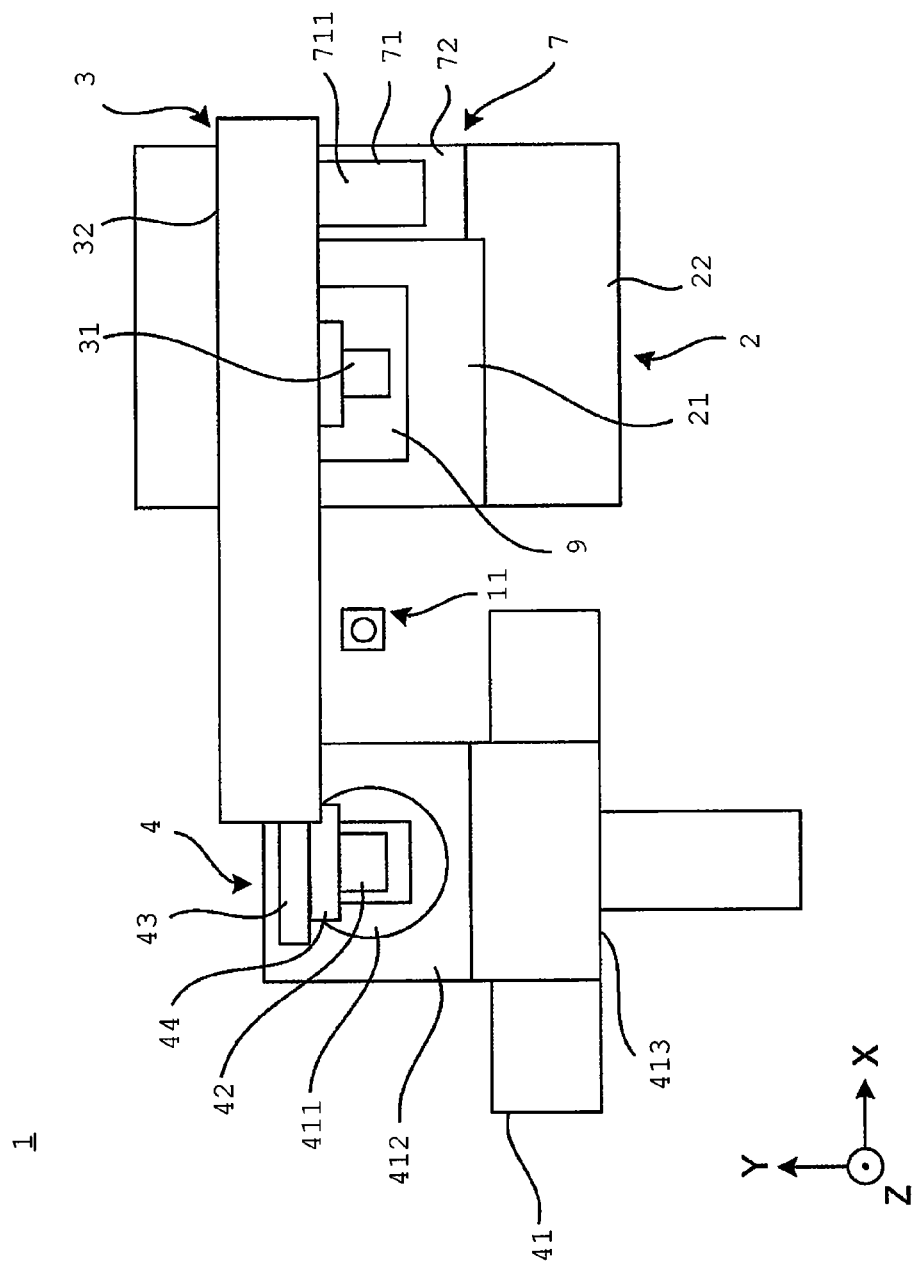
FIG. 2 is a schematic plan view of the electronic component mounting apparatus according to the embodiment of the present invention.

Next mainly referring to FIG. 1 to FIG. 3 an operation of an electronic component mounting apparatus of the present embodiment is described. Further one embodiment of an electronic component mounting method while describing the operation of the electronic component mounting apparatus.

A tray moving mechanism 413 moves the component tray 411 on which the large number of electronic components 8 are placed with their bonding surface in (Z+) direction, to a place under the supply head 42 which is positioned at (−X) side. And the supply collet 421 holds the bonding surface of the electronic component 8 by suction.

Further the supply head moving mechanism 43 moves the supply head 42 to (+X) direction while reversing it. The supply collet 421 is opposed to the bonding tool 5 of the component mounting part 31, at such position for transferring the electronic component 8.

Further the pressing unit 33 moves the shaft 35 slightly downward and when the tip end part 531 of the bonding action part 53 holds the upper surface of the electronic component 8 with suction, the supply collet 421 stops the suction and thereby the bonding action part 53 receives the electronic component 8 from the supply collet 421.

Thus the bonding action part 53 holds the electronic component 8 (an electronic component holding step).

After the electronic component 8 is received, the pressing unit 33 moves the shaft 35 slightly upward and the supply head 42 shunts to the original position.

While the supply head 42 shunts, the component mounting part 31 moves to a place right above the image pick-up part 11 and the image pick-up part 11 picks up an image of the electronic component 8 held by the tip end part 531.

Image data from the pick-up part 11 is transmitted to the controlling part 10 and the controlling part 10 controls the component mounting part 31 to revise posture of the electronic component 8 on the basis of the transmitted image data.

Meanwhile when the controlling part 10 can not revise the posture of the electronic component 8 on account of suction error and the like, the mounting operation of the electronic component 8 is stopped, and the component mounting part 31 moves to such position above a component collection device (not shown in figure) and the electronic component 8 is collected.

The mounting part moving mechanism 32 moves the component mounting part 31 to such place above a position where the electronic component 8 is to be mounted on the circuit board 9 held by the substrate holding part 2.

Next the bonding tool 5 moves downward to the circuit board 9 and a bump formed at the bonding surface of the electronic component 8 comes into contact with an electrode of the circuit board 9.

Successively the pressing unit 33 moves the shaft 35 downward.

Thus the pressing unit 33 presses the electronic component 8 (pressing step).

And the ultrasonic transducer 52 generates the ultrasonic vibration (ultrasonic vibration generating step), and the heater 57 heats the bonding action part 53 (heating step), and air flows through the first cooling part 515 and the second cooling part 516 (fluid flowing step).

Thus the bump formed on the bonding surface of the electronic component 8 is electrically bonded to the electrode of the circuit board 9 when the electronic component 8 is mounted.

After the mounting of the electronic component 8, the bonding action part 53 stops the suction of the electronic component 8 and the pressing unit 33 moves the bonding action part 53 upward from the electronic component 8.

Successively it is confirmed whether polishing of the surface of the tip end part 531, which contacts with the electronic component 8, is necessary or not.

When the polishing is necessary, the component mounting part 31 moves to a position above the polishing part 7 and the tip end part 531 is pressed on the polishing member 71 and is vibrated for polishing by the ultrasonic transducer 52.

After the polishing of the tip end part 531 is completed or when the polishing is not necessary, it is confirmed whether the mounting of the electronic component 8 is to be continued or not.

And when the mounting of the electronic component 8 is continued, the component mounting part 31 moves to the position again for receiving the electronic component 8 from the supply collet 421 and the above described mounting operation for mounting the electronic component 8 on the circuit board 9 is repeated.

Finally when all electronic components 8 for mounting are mounted on the circuit board 9, the mounting operation is finished.

Then according to the present embodiment the possibility can be decreased that the expansion leads to a deviation of the direction or amplitude of the vibration of the held electronic component 8 from the designed value and to a change of the vibration mode.

Figure 14:
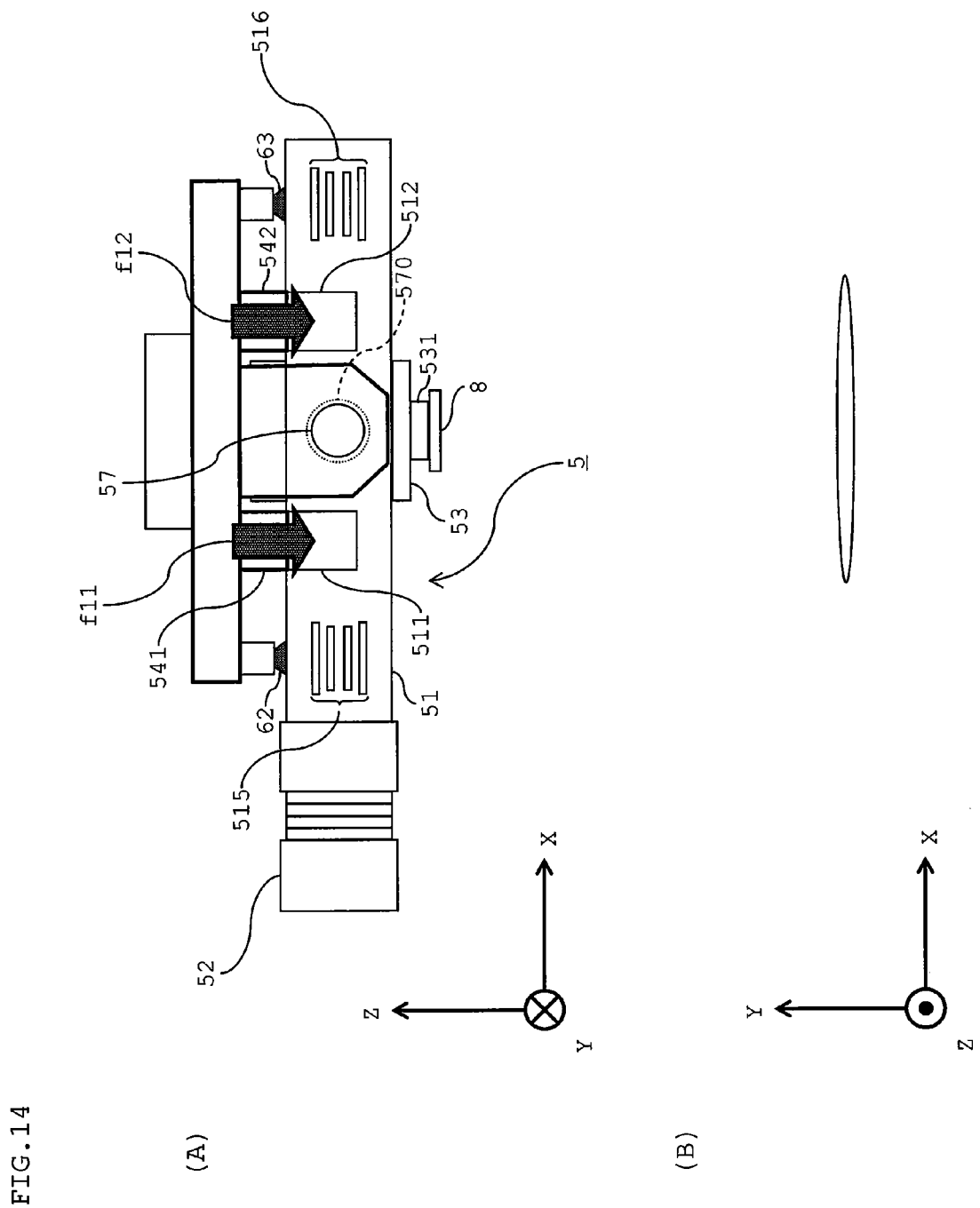
FIG. 14(A) is a (first) diagram for illustrating an operation principle of the electronic component mounting apparatus according to the embodiment of the present invention.
FIG. 14(B) is a (first) diagram for illustrating a vibration trajectory of the electronic component to which an ultrasonic vibration is applied by the electronic component mounting apparatus according to the embodiment of the present invention.

That is the first cooling part 515 and the second cooling part 516 are designed as being approximately symmetrical with respect to the plane of symmetry S2, and therefore the increase of the length and the thickness at the heating of the horn 51 becomes approximately symmetrical with respect to the X direction. Then as shown in FIG. 14(A) which is a (first) diagram for illustrating an operation principle of the electronic component mounting apparatus 1 according to the embodiment of the present invention, the pressed load f12 from the horn holding block 512 side is about equal to the pressed load f11 from the horn holding block 511 when the pressing. Therefore as shown in FIG. 14(B) which is a (first) diagram for illustrating a vibration trajectory of the electronic component 8 to which an ultrasonic vibration is applied by the electronic component mounting apparatus 1 according to the embodiment of the present invention, the vibration of the electronic component 8 does not come and go in the straight line of an ideal X direction but moves on a trace of such oval the direction of the long axis of which accords with the X direction and the eccentricity of which is near 1 within the XY plane. That is the vibration trajectory of the electronic component 8 does not largely change on account of the heating of the heater 57.

Figure 15:
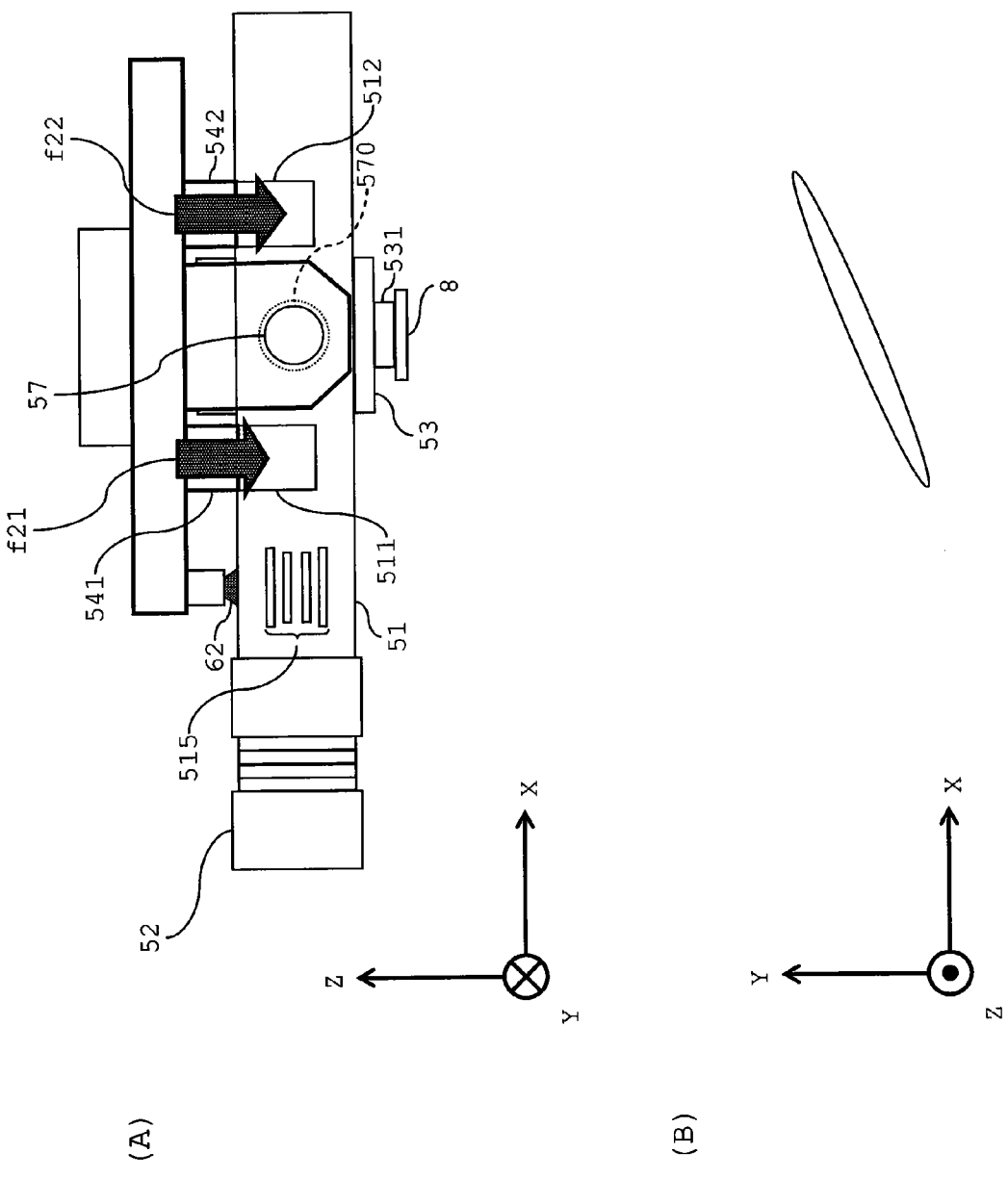
FIG. 15(A) is a (second) diagram for illustrating an operation principle of the electronic component mounting apparatus according to the embodiment of the present invention.
FIG. 15(B) is a (second) diagram for illustrating a vibration trajectory of the electronic component to which an ultrasonic vibration is applied by the electronic component mounting apparatus according to the embodiment of the present invention.
Figure 16:
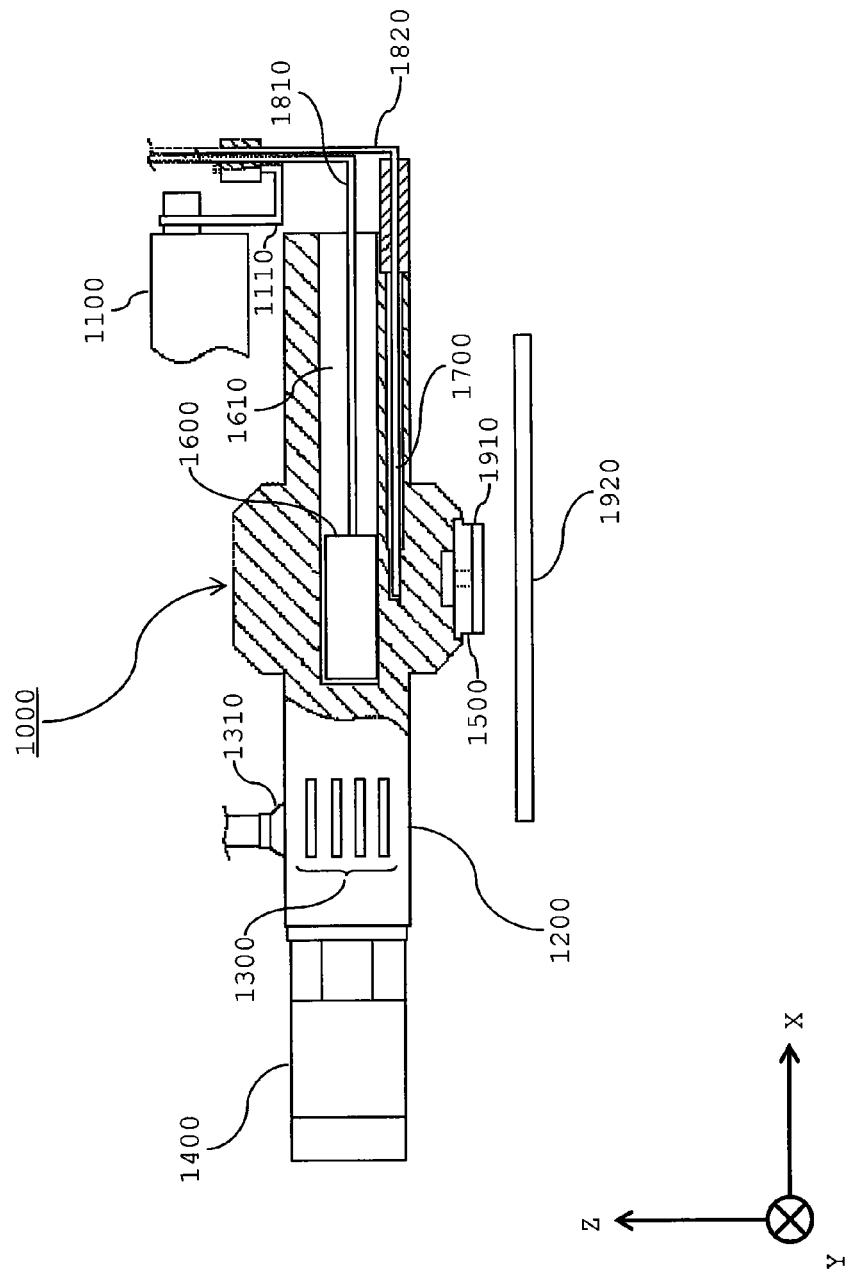
FIG. 16 is a schematic front view of a conventional bonding tool.

However if only the first cooling part 515 is provided, the increase of the length and the thickness at the heating of the horn 51 does not become approximately symmetrical with respect to the X direction. That is the increase of the length and the thickness becomes larger between the heater disposition part 570 and the other edge at the (+X) direction side of the horn 51, than the increase of the length and the thickness between the heater disposition part 570 and the edge at the (−X) direction side of the horn 51. Then as shown in FIG. 15(A) which is a (second) diagram for illustrating an operation principle of the electronic component mounting apparatus 1 according to the embodiment of the present invention, the pressing load f22 from the horn holding block 512 becomes larger than the pressing load f21 from the horn holding block 511 when pressing on account of the reaction according to the increase of the thickness of the horn 51. As the result as shown in FIG. 15(B) which is a (second) diagram for illustrating a vibration trajectory of the electronic component 8 to which an ultrasonic vibration is applied by the electronic component mounting apparatus 1 according to the embodiment of the present invention, the vibration of the electronic component 8 moves on a trace of such oval the direction of the long axis of which does not accord with the X direction, within the XY plane.

Here the electronic component mounting apparatus 1 is very useful for such technical field of semiconductor flip chip mounting in which bonding of gold material with gold material is executed and further in which very precise heat controlling is required for maintaining very high temperature by the heater 57.

Further the electronic component mounting apparatus 1 is useful for such semiconductor flip chip mounting in which (1) the electronic component 8 is such chip having large size in the X direction which is the longitudinal direction of the horn 51 or having thin size in the Z direction, and/or (2) the circuit board 9 is a tape member where electric wiring is formed like sheet or is a member where electric wiring is formed on a resin material.

The reason is that in such highly advanced semiconductor flip chip mounting, it is more necessary to decrease the possibility that the expansion leads to a deviation of the direction or amplitude of the vibration of the held electronic component 8 from the designed value and to a change of the vibration mode. In the electronic component mounting apparatus 1 of the present invention such possibility is low as described above. Therefore in the electronic component mounting apparatus 1 of the present invention it is hardly necessary to make parallel alignment for suppressing such problem that the electrode of the electronic component 8 or the circuit board 9 catches damage or poor bonding occurs on account of such state that the electronic component 8 inclines for the circuit board 9.

Thus various device sizes and kinds of the electronic component 8 which can be processed by the electronic component mounting apparatus 1 of the present invention, increase more than conventional, and therefore the electronic component mounting apparatus 1 of the present invention is useful for various fields.

Meanwhile the mathematical words as like perpendicular, parallel and so on in the present application include, besides close meanings, such meanings of substantially perpendicular, substantially parallel and so on as far as there is no hindrance when the above described functions are performed.

Of course the present invention is not restricted to the above described embodiments and includes other many embodiments.

INDUSTRIAL UTILITY

The bonding tool, the electronic component mounting apparatus and the electronic component mounting method of the present invention are capable of performing ultrasonic bonding of higher quality, and is useful for the semiconductor flip chip mounting and so on.

What is claimed is:
1. A bonding tool, comprising:
a horn which transmits an ultrasonic vibration;
an ultrasonic transducer which is provided on one end of the horn, and produces the ultrasonic vibration;
a heater disposition part, in which a heater is disposed, which is provided between the one end of the horn and the other end of the horn;
a bonding action part which is provided between the one end of the horn and the other end of the horn, holds an electronic component, and is heated by the heater;
a first cooling part, through which a fluid flows, which is provided between the heater disposition part and the one end of the horn; and
a second cooling part, through which a fluid flows, which is provided between the heater disposition part and the other end of the horn, wherein the heater disposition part is a heater insertion hole which penetrates the horn in a direction that is perpendicular to a direction in which the ultrasonic vibration is transmitted, and the heater is fixed to a heater holding block with a predetermined clearance between the heater and a wall of the heater insertion hole so that the heater is not in contact with the horn, the heater holding block being disposed outside of the horn and connected to a pressing unit externally provided.

2. The bonding tool according to claim 1, wherein the bonding action part is provided on a lower surface of the horn, and the heater disposition part is provided immediately above the bonding action part.

3. The bonding tool according to claim 1, wherein a distance between the heater disposition part and the first cooling part is equal to a distance between the heater disposition part and the second cooling part.

4. The bonding tool according to claim 1, wherein the first cooling part and the second cooling part are air holes, through which a gas flows, which penetrate the horn in a direction that is perpendicular to a direction in which the ultrasonic vibration is transmitted.

5. The bonding tool according to claim 4, wherein an opening of the air hole is shaped like a narrow rectangle, whose longitudinal direction agrees with the direction in which the ultrasonic vibration is transmitted.

6. The bonding tool according to claim 1, wherein the horn is shaped like a prism, the bonding action part is provided on a lower surface of the horn, and horn holding blocks for holding the horn are provided on each of two side surfaces of the horn.

7. The bonding tool according to claim 6, wherein the horn holding block has a rib provided on the side surface of the horn, and a body connected to the rib, and a longitudinal direction of the rib agrees with a direction that is perpendicular to a direction in which the ultrasonic vibration is transmitted, and is perpendicular to the lower surface of the horn.

8. The bonding tool according to claim 7, wherein the body has a groove which is formed, adjacent to the rib, in the longitudinal direction of the rib.

9. The bonding tool according to claim 6, wherein the horn holding blocks are provided so that two blocks are disposed on each of the two side surfaces of the horn, the first cooling part is provided between one horn holding block of the two horn holding blocks, which is nearer to the one end of the horn, and the one end of the horn, and the second cooling part is provided between the other horn holding block of the two horn holding blocks, which is nearer to the other end of the horn, and the other end of the horn.

10. The bonding tool according to claim 1, wherein the ultrasonic vibration has two nodal points, the first cooling part is provided between one nodal point of the two nodal points, which is nearer to the one end of the horn, and the one end of the horn, and the second cooling part is provided between the other nodal point of the two nodal points, which is nearer to the other end of the horn, and the other end of the horn.

11. The bonding tool according to claim 1, wherein a fluid flowing unit, which allows the fluid to flow through at least one of the first cooling part and the second cooling part, is externally provided.

12. The bonding tool according to claim 1, wherein a suction port of a suction path for holding the electronic component by suction is formed in the bonding action part, an exhaust port of the suction path is formed at a position nearer to the one end of the horn than the other end of the horn, in an upper surface of the horn, the suction path is shaped like the letter T, and a part of the suction path is a hole bored from a part of the one end of the horn, against which the ultrasonic transducer is to abut.

13. An electronic component mounting apparatus, comprising:

a holding part which holds a target object;

a supplying part which supplies an electronic component; and a mounting unit which mounts the supplied electronic component on the held target object, wherein the mounting unit has a component mounting part, the component mounting part has a pressing unit and the bonding tool according to claim 1, and the pressing unit presses the electronic component against the target object via the bonding action part of the bonding tool.

14. An electronic component mounting method of mounting the electronic component on the target object using the electronic component mounting apparatus according to claim 13, the electronic component mounting method comprising:

an electronic component holding step of holding the electronic component using the bonding action part;

a pressing step of pressing the electronic component against the target object using the pressing unit;

an ultrasonic vibration generating step of generating the ultrasonic vibration using the ultrasonic transducer;

a heating step of heating the bonding action part using the heater; and a fluid flowing step of allowing the fluid to flow using the first cooling part and the second cooling part.

* * * * *